United States Patent
Park et al.

(10) Patent No.: US 8,580,606 B2
(45) Date of Patent: Nov. 12, 2013

(54) METHOD OF FORMING RESISTANCE VARIABLE MEMORY DEVICE

(75) Inventors: Jeong-Hee Park, Hwaseong-si (KR); Jung-Hwan Park, Seoul (KR); Hideki Horii, Seoul (KR); Sung-Lae Cho, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 89 days.

(21) Appl. No.: 13/241,315

(22) Filed: Sep. 23, 2011

(65) Prior Publication Data

US 2012/0142141 A1 Jun. 7, 2012

(30) Foreign Application Priority Data

Dec. 3, 2010 (KR) ........................ 10-2010-0122824

(51) Int. Cl.
*H01L 21/06* (2006.01)
(52) U.S. Cl.
USPC ............................................. 438/102; 257/3
(58) Field of Classification Search
USPC ............................................... 257/3; 438/102
See application file for complete search history.

(56) References Cited

U.S. PATENT DOCUMENTS

| | | | |
|---|---|---|---|
| 6,764,894 B2 | 7/2004 | Lowrey | |
| 7,575,776 B2 | 8/2009 | Horii | |
| 2009/0035514 A1* | 2/2009 | Kang et al. | 428/131 |
| 2009/0206318 A1* | 8/2009 | Ko et al. | 257/4 |
| 2010/0038614 A1* | 2/2010 | Hampton | 257/2 |

FOREIGN PATENT DOCUMENTS

| | | |
|---|---|---|
| JP | 4150667 B2 | 9/2008 |
| JP | 2009-038379 A | 2/2009 |
| KR | 10-2004-0032955 A | 4/2004 |
| KR | 10-2006-0012182 A | 2/2006 |
| KR | 10-2009-0013419 A | 2/2009 |

* cited by examiner

*Primary Examiner* — Zandra Smith
*Assistant Examiner* — Jamie C Niesz
(74) *Attorney, Agent, or Firm* — Lee & Morse, P.C.

(57) ABSTRACT

A method of forming a resistance variable memory device, the method including forming a diode on a semiconductor substrate; forming a lower electrode on the diode; forming a first insulating film on the lower electrode, the first insulating film having an opening; forming a resistance variable film filling the opening such that the resistance variable film includes an amorphous region adjacent to a sidewall of the opening and a crystalline region adjacent to the lower electrode; and forming an upper electrode on the resistance variable film.

20 Claims, 23 Drawing Sheets

METHOD OF FORMING RESISTANCE VARIABLE MEMORY DEVICE

CROSS-REFERENCE TO RELATED APPLICATION

Korean Patent Application No. 10-2010-0122824, filed on Dec. 3, 2010, in the Korean Intellectual Property Office, and entitled: "Method of Forming Resistance Variable Memory Device," is incorporated by reference herein in its entirety.

BACKGROUND

1. Field

Embodiments relate to a method of forming a resistance variable memory device.

2. Description of Related Art

A semiconductor device, e.g., a PRAM (Phase-change Random Access Memory) device, may include a resistance variable pattern in a memory cell thereof.

SUMMARY

Embodiments are directed to a method of forming a resistance variable memory device.

The embodiments may be realized by providing a method of forming a resistance variable memory device, the method including forming a diode on a semiconductor substrate; forming a lower electrode on the diode; forming a first insulating film on the lower electrode, the first insulating film having an opening; forming a resistance variable film filling the opening such that the resistance variable film includes an amorphous region adjacent to a sidewall of the opening and a crystalline region adjacent to the lower electrode; and forming an upper electrode on the resistance variable film.

The resistance variable film may include a first element having a heat of vaporization of greater than about 200 kJ/mol, a chalcogen element having a heat of vaporization of less than about 200 kJ/mol, and at least one of a metal element, a metalloid element, and a nonmetal element.

A concentration of the first element in the crystalline region may be lower than a concentration of the first element in the amorphous region.

A concentration of the chalcogen element in the crystalline region may be higher than a concentration of the chalcogen element in the amorphous region.

The first element may include germanium.

The resistance variable film may further include a second element having a heat of vaporization of less than about 200 kJ/mol.

The first element may include germanium, the chalcogen element may include tellurium, and the second element may include antimony.

The crystalline region may include a greater amount of a $Ge_2Sb_2Te_5$ structure than an amount thereof in the amorphous region.

The method may further include forming a second insulating film having a contact hole therein, wherein the contact hole is filled with the diode and the lower electrode, and the opening has a trench shape.

The embodiments may also be realized by providing a method of forming a resistance variable memory device, the method including preparing a deposition apparatus such that the deposition apparatus includes a substrate chucking member and a target in a process chamber, the substrate chucking member including a heater and the target including a deposition source material; mounting a semiconductor substrate on the substrate chucking member in the process chamber, the semiconductor substrate including an insulating film having an opening therein; injecting a process gas into the process chamber, exciting the process gas, and transforming the process gas into a plasma; colliding ions of the plasma with the target to separate the deposition source material from the target; depositing the deposition source material on a top surface of the insulating film to form a first deposition film partially filling the opening; and forming a second deposition film on the first deposition film, wherein forming the second deposition film includes vaporizing a part of the deposition source material in the first deposition film to further fill the opening, and the deposition source material includes a first element having a heat of vaporization of greater than about 200 kJ/mol, a second element including a chalcogen element, and a third element having a heat of vaporization of less than about 200 kJ/mol.

The deposition source material may further include at least one of bismuth, carbon, oxygen, nitrogen, boron, aluminum, phosphorus, gallium, and arsenic.

The process gas may include an inert gas, the process chamber may have an internal pressure of about 0.1 mTorr to about 10 mTorr, and the heater may have a temperature of about 260° C. to about 350° C.

A distance between the semiconductor substrate and the target may be about 200 mm to about 600 mm.

Vaporized parts of the deposition source material may include the chalcogen element, and a concentration of the chalcogen element in the opening may be higher than a concentration thereof on the insulating film.

The first deposition film may be conformally formed along a sidewall of the opening and the top surface of the insulating film.

The embodiments may also be realized by providing a method of forming a resistance variable memory device, the method including providing a semiconductor substrate; forming a word line on the semiconductor substrate; forming a first insulating film in the word line such that the first insulating film includes a first connection hole therein; forming a switching device in the first connection hole; forming a second insulating film on the first insulating film such that the second insulating film includes a second connection hole therein; forming a lower electrode in the second connection hole such that the lower electrode is connected to the switching device; forming a third insulating film on the second insulating film such that the third insulating film includes an opening therein; depositing a resistance variable film on the third insulating film and in the opening such that the resistance variable film includes a first element having a heat of vaporization of greater than about 200 kJ/mol, a chalcogen element having a heat of vaporization of less than about 200 kJ/mol, and at least one second element, the second element including a metal element, a metalloid element, or a nonmetal element; processing the resistance variable film such that some of the chalcogen element and the second element of the resistance variable film is transferred from a top of the third insulating film to an interior of the opening to fill the opening; forming a resistance variable pattern by removing portions of the resistance variable film such that a top surface of the third insulating film is exposed; and forming an upper electrode on the resistance variable pattern.

Processing the resistance variable film may include forming an amorphous region adjacent to sidewalls of the opening and a crystalline region surrounded by the amorphous region.

A concentration of the first element in the crystalline region may be lower than a concentration of the first element in the amorphous region.

The first element may include germanium, the chalcogen element may include tellurium, and the second element may include antimony.

The second element may have a heat of vaporization of less than about 200 kJ/mol.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
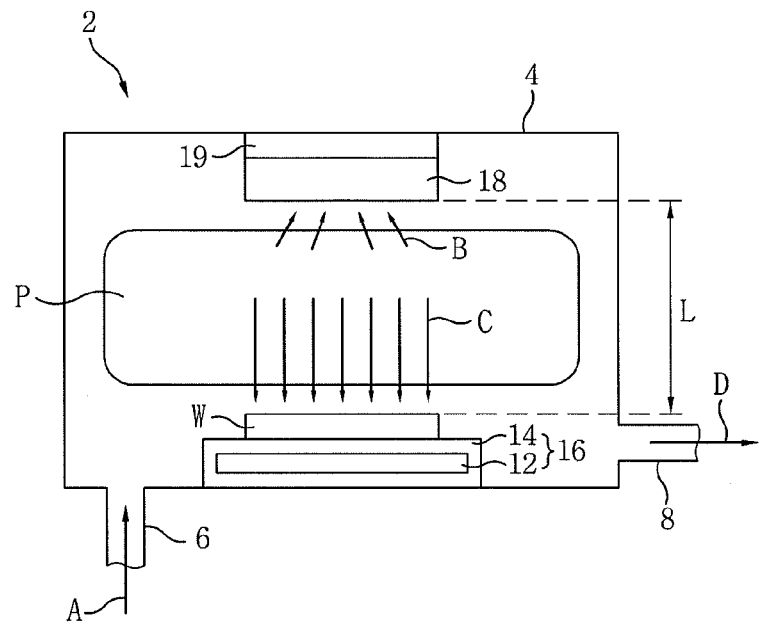
FIG. 1 illustrates a schematic view showing a physical vapor deposition apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "underlying" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" with another element, it can be directly connected, or coupled with the other element or intervening elements may be present. In contrast, if an element is referred to as being "directly connected" with another element, there are no intervening elements present. Other words used to describe the relationship between elements should be interpreted in a like fashion (e.g., "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" other elements or features would then be "upper" elements or features. Thus, the exemplary term "lower" can encompass both an orientation of upper and lower. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A method of forming a resistance variable memory device according to an embodiment will be described in further detail by referring to the accompanied drawings.

Figure 2:
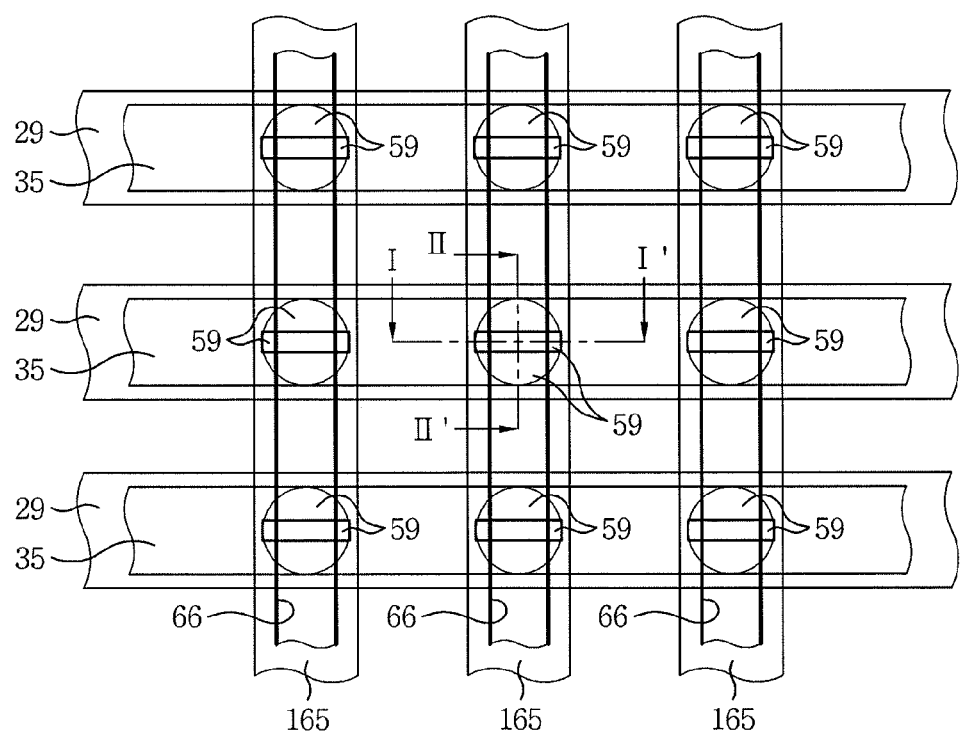
FIG. 2 illustrates a layout view showing a resistance variable memory device according to an embodiment.

FIG. 1 illustrates a schematic view showing a physical vapor deposition apparatus according to an embodiment. In this case, FIG. 1 will be described together with FIG. 11 while illustrating an embodiment. FIG. 2 illustrates a layout view showing a resistance variable memory device according to an embodiment.

Referring to FIG. 2, the resistance variable memory device 170A according to an embodiment may include active regions 29 and word lines 35. The number of active regions 29 may be the same as the number of the word lines 35. The active regions 29 may be disposed along the same direction as the word lines 35.

The word lines 35 may overlie respective active regions 29. For example, the word lines 35 may be disposed in the active regions 29. The resistance variable memory device 170A may further include openings 66 and bit lines 165. The number of openings 66 may be the same as the number of the bit lines 165.

The openings 66 may be disposed along the same direction as the bit lines 165. The openings 66 may have a linear shape. The openings 66 may be respectively filled with a resistance variable pattern 121 (see FIG. 16). The bit lines 165 may overlie the openings 66. For example, the bit lines 165 may cover the respective openings 66.

Selective devices 59 may be disposed at intersections of the word lines 35 and the bit lines 165. The selective devices 59 may have an electrically switching function. The selective devices 59 may include, e.g., a diode. In an implementation, the selective devices 59 may have a shape different from that illustrated in FIG. 2.

FIGS. 3 to 22 illustrate cross-sectional views taken along lines I-I' and II-II' of FIG. 2, showing stages in a method of forming the resistance variable memory device of FIG. 2.

Figure 3:
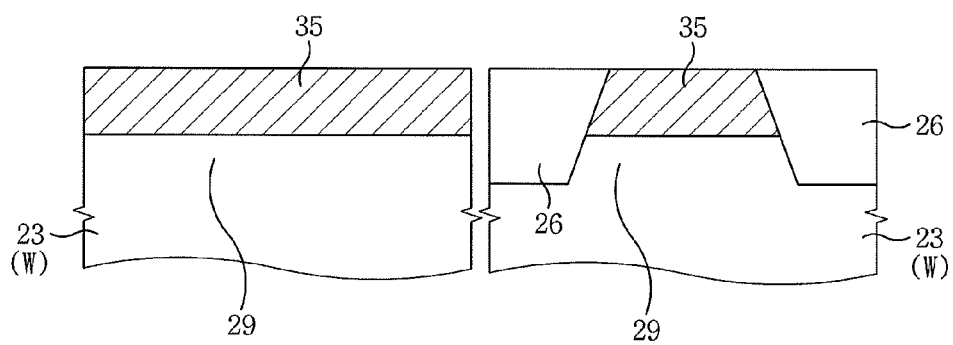
FIGS. 3 to 22 illustrate cross-sectional views taken along lines I-I' and II-II' of FIG. 2, showing stages in a method of forming the resistance variable memory device of FIG. 2.

Referring to FIG. 3, a semiconductor substrate 23 (W) may be prepared. The semiconductor substrate 23 (W) may have a conductivity of p-type impurity ions. An inactive region 26 may be formed in the semiconductor substrate 23 (W). The inactive region 26 may include an insulating material. The inactive region 26 may define an active region 29 of FIG. 2.

The word line 35 may be formed in the active region 29. The word line 35 may be confined to the inactive region 26. The word line 35 may extend from a top surface of the active region 29 toward an interior of the active region 29. The word line 35 may have a conductivity of n-type impurity ions, e.g., different from the semiconductor substrate 23 (W).

Figure 4:
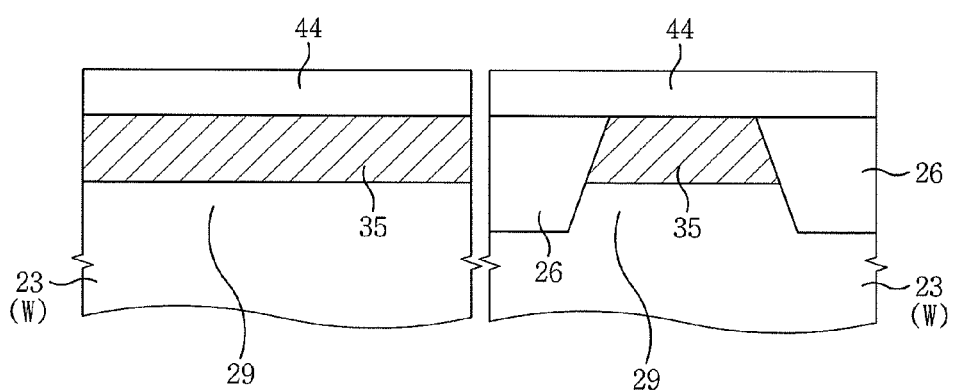

Referring to FIG. 4, a first insulating film 44 may be formed on the inactive region 26 and the active region 29. The first insulating film 44 may cover the word line 35. The first insulating film 44 may have an etch rate different from that of the inactive region 26. The first insulating film 44 may include an insulating material and an impurity element, e.g., boron, phosphorus, or carbon, or, alternatively, may not include an impurity element at all. The first insulating film 44 may include a single layer or a plurality of layers.

Figure 5:
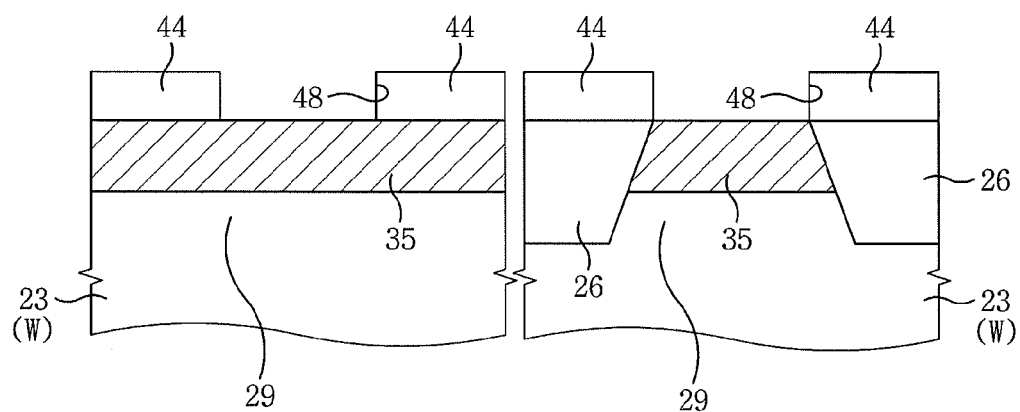

Referring to FIG. 5, a first connection hole 48 may be formed in the first insulating film 44. The first connection hole 48 may extend from a top surface of the first insulating film 44 toward a bottom surface thereof. For example, the first connection hole 48 may vertically penetrate the first insulating film 44.

The first connection hole 48 may expose the word line 35 in the active region 29. When viewed in a plan view, an area of the first connection hole 48 may be the same size as a circular area of the selective device 59 of FIG. 2.

Figure 6:
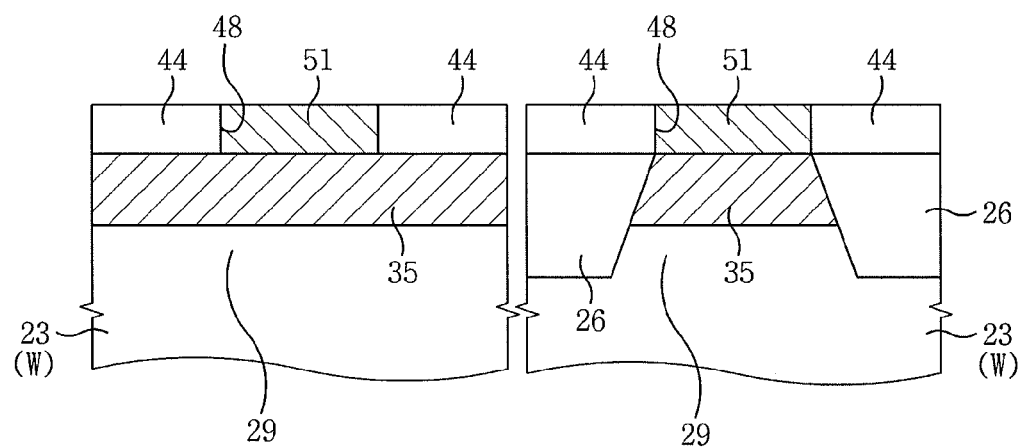

Referring to FIG. 6, a switching device 51 may be formed in the first connection hole 48 of the first insulating film 44. The switching device 51 may include a lower conductive layer and an upper conductive layer stacked on the lower conductive layer. The lower conductive layer may have a conductivity of the same impurity ions as the word line 35.

The upper conductive layer may have a conductivity of the same impurity ions as the semiconductor substrate 23 (W). Each of the lower and upper conductive layers may include, e.g., monocrystalline silicon and/or polycrystalline silicon. The switching device 51 may be electrically operated as a diode through the lower and upper conductive layers.

The switching device 51 may connect the word line 35 through the first connection hole 48.

Figure 7:
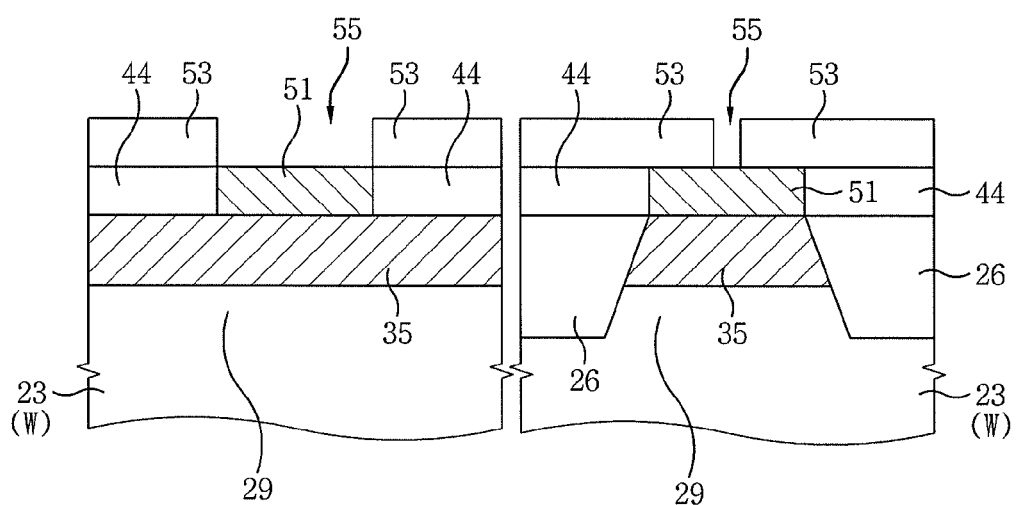

Referring to FIG. 7, a second insulating film 53 may be formed on the first insulating film 44. The second insulating film 53 may include an insulating material having the same etch rate as the first insulating film 44. In an alternative implementation, the second insulating film 53 may include an insulating material having an etch rate different from that of the first insulating film 44.

The second insulating film 53 may include an insulating material and an impurity element, e.g., boron, phosphorus, or carbon, or, alternatively, may not include an impurity element at all. The second insulating film 53 may cover the switching device 51. A second connection hole 55 may be formed in the second insulating film 53. The second connection hole 55 may extend from a top surface of the second insulating film 53 toward a bottom surface of the second insulating film 53.

When viewed in a plan view, an area of the second connection hole 55 may be the same size as an area occupied by a bar or a line of the selective device 59 as shown in FIG. 2. The second connection hole 55 may vertically penetrate the second insulating film 53 to expose the switching device 51.

Figure 8:
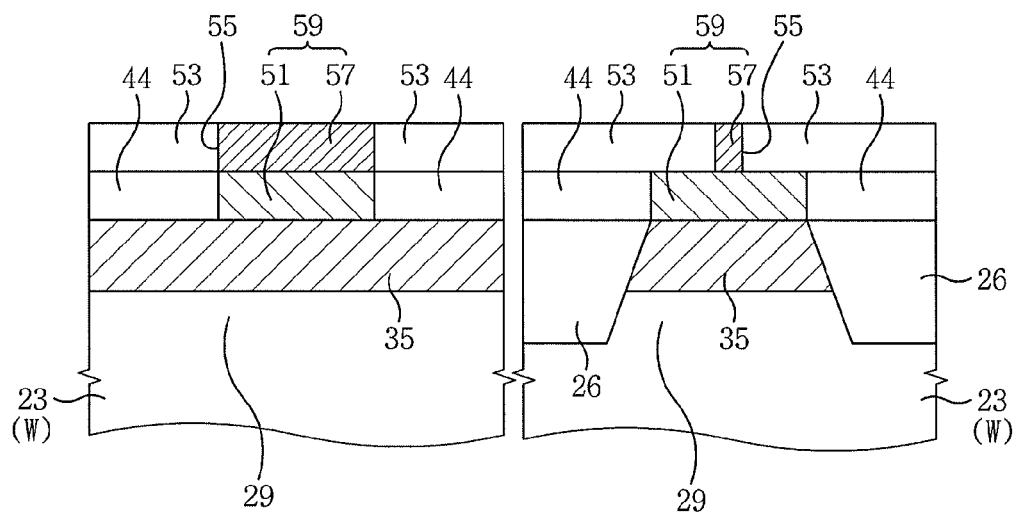

Referring to FIG. 8, a lower electrode 57 may be formed in the second connection hole 55 of the second insulating film 53. The lower electrode 57 may fill the second connection hole 55. The lower electrode 57 may include a metal and/or a metal nitride. The lower electrode 57 may be in contact with the switching device 51 through the second insulating film 53.

The lower electrode 57 together with the switching device 51 may constitute the selective device 59 of FIG. 2.

Figure 9:
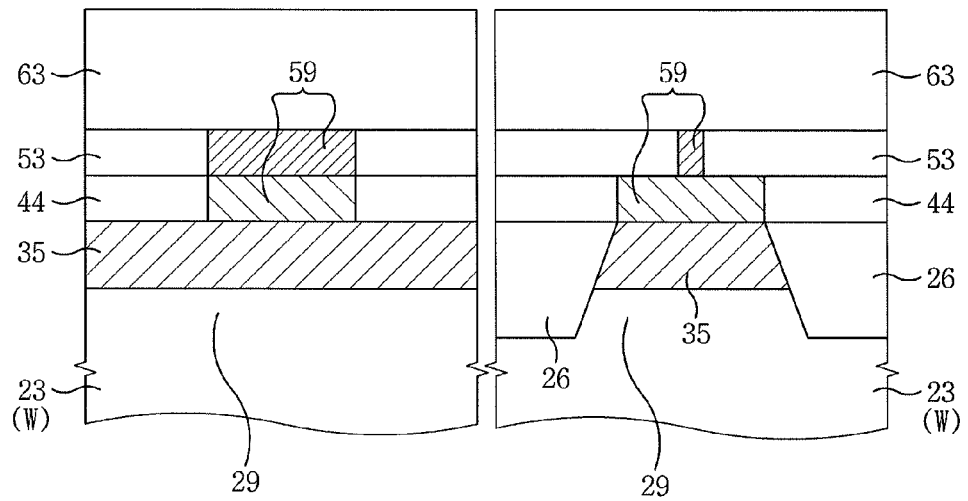

Referring to FIG. 9, a third insulating film 63 may be formed on the second insulating film 53. The third insulating film 63 may include an insulating material having the same etch rate as the second insulating film 53. Alternatively, the third insulating film 63 may include an insulating material having a different etch rate from that of the second insulating film 53.

The third insulating film 63 may include an insulating material, which may include an impurity element, e.g., boron, phosphorus, or carbon, or, alternatively, may not include an impurity element at all. The third insulating film 63 may cover the selective device 59.

Figure 10:
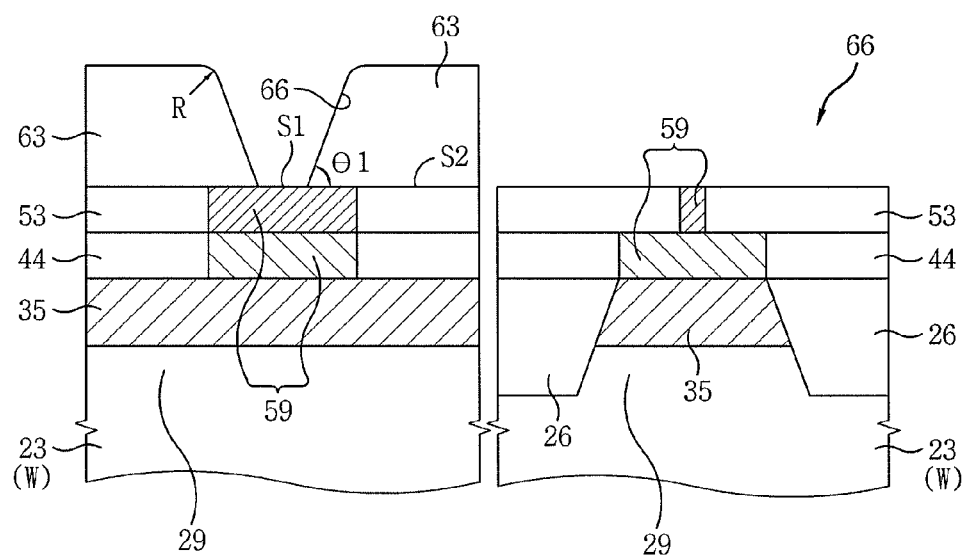

Referring to FIG. 10, an opening 66 may be formed in the third insulating film 63. When viewed in a plan view, the opening 66 may have a trench shape intersecting the active region 29 and the word line 35. The opening 66 may extend from a top surface of the third insulating film 63 toward a bottom surface of the third insulating film 63.

An upper width of the opening 66 may be larger than a lower width thereof. For example, a sidewall of the opening 66 may be inclined with respect to a top surface S1 of the lower electrode 57 and/or the top surface S2 of the second insulating layer 53. The sidewall of the opening 66 may have an inclined angle θ1 of about 70° to about 89° with respect to the top surface S1 of the lower electrode 57 and/or the top surface S2 of the second insulating layer 53.

Depending on the inclined angle θ1, filling characteristics the opening 66 may be controlled. For example, as the inclined angle θ1 decreases, the filling characteristics of the opening 66 may improve; and as the inclined angle θ1 increases, the filling characteristics of the opening 66 may become poorer. Accordingly, the inclined angle θ1 may influence the optimum conditions for carrying out the method according to an embodiment.

As the inclined angle θ1 approaches a right angle, physical integration and electrical characteristics of the resistance variable memory device may be favorable. However, if the inclined angle θ1 were to be a right angle, the filling characteristics of the opening 66 may deteriorate (due to the shape of the opening). Also, if the inclined angle θ1 were to be a right angle, the opening may cause crowding of an electric field at a portion of the right angle therein, thereby resulting in physical damage and durability deterioration of the resistance variable memory device.

Accordingly, an entrance (or mouth) portion, or a corner portion of the opening 66 may be rounded, e.g., may have a radius R of curvature. The opening 66 may expose a portion of a top surface of the selective device 59.

Figure 11:
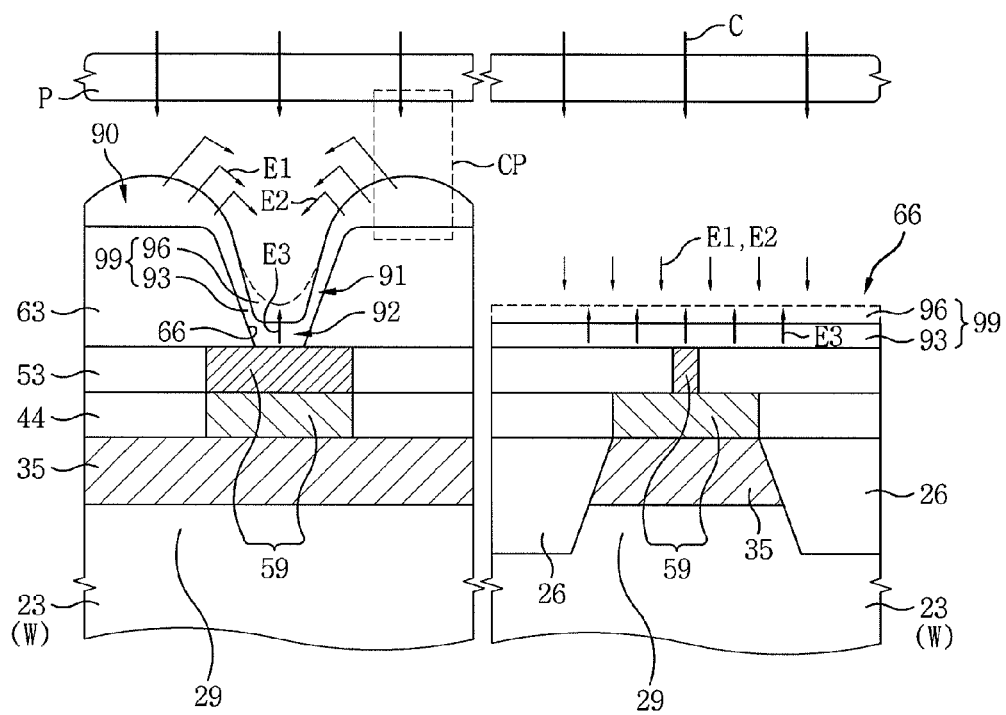

Referring to FIG. 11, the semiconductor substrate 23 (W) (including the third insulating film 63) may be inserted into a process chamber 4 of the physical vapor deposition apparatus 2 of FIG. 1. The process chamber 4 may include a substrate chucking member 16, a target 18, and a target supporting member 19.

The substrate chucking member 16 may be disposed in a lower portion of the process chamber 4 and may include a heater 12 and an electrostatic chuck 14. The target 18 may be coupled with the target supporting member 19 to face the substrate chucking member 16. The target 18 may include a deposition source material.

The deposition source material may include a resistance variable material or a phase-change material. The deposition source material may include, e.g., at least one element such as selenium, tellurium, or polonium (in group sixteen, i.e., the chalcogen group of the periodic table), and at least one positive or other element different from the at least one element of the chalcogen group.

In an implementation, the deposition source material may include at least one element having heat of vaporization of greater than about 200 kJ/mol, at least one chalcogen element having heat of vaporization of less than about 200 kJ/mol, and at least one of a metal element, a metalloid element, and a nonmetal element.

The at least one element having heat of vaporization of greater than about 200 kJ/mol may include, e.g., germanium (330.9 kJ/mol) and/or indium (231.5 kJ/mol). The metal element may include, e.g., a transition metal. In an implementation, the transition metal may include at least one of titanium, zirconium, iron, cobalt, nickel, copper, tungsten, and tantalum.

The metal element may include a representative metal in the periodic table. The metal element in the representative metal may include at least one of aluminum, gallium, indium, tin, lead, bismuth, and thallium. The metalloid element may include at least one of boron, silicon, germanium, antimony, and arsenic. The nonmetal element may include at least one of carbon, nitrogen, oxygen, and phosphorus.

For example, the deposition source material may include germanium, antimony, and tellurium, and one of bismuth, carbon, oxygen, nitrogen, and aluminum. The chalcogen element may have heat of vaporization as shown in Table 1, below.

TABLE 1

| Chalcogen Element | Heat of Vaporization (kJ/mol) |
|---|---|
| Selenium | 37.7 |
| Tellurium | 52.55 |
| Polonium | 102.9 |

The metal element, the metalloid element, or the nonmetal element may function as a depressor, retarding a directional crystallization of a chalcogenide. Directional crystallization may refer to crystallizing the chalcogenide as a pillar shape in an arbitrary direction. The depressor may maintain the chalcogenide in an amorphous state or a fine crystallization state. For example, the depressor may function to maintain the chalcogenide in a nano-crystallization state.

Aluminum, bismuth, carbon, nitrogen, and oxygen may have heat of vaporization as shown in Table 2, below.

TABLE 2

| Element | Heat of Vaporization (kJ/mol) |
|---|---|
| Aluminum | 293.4 |
| Bismuth | 104.8 |
| Carbon | 355.8 |
| Nitrogen | 2.7928 |
| Oxygen | 3.4099 |

Alternatively, the deposition source material may include at least one first element having heat of vaporization of greater than about 200 kJ/mol, at least one chalcogen element, and at least one second element having heat of vaporization of less than about 200 kJ/mol (and being different from the at least one chalcogen element).

The target supporting member 19 may be fixed to a ceiling of the process chamber 4. The semiconductor substrate 23 (W) (including the third insulating film 63) may be mounted on the electrostatic chuck 14 in the process chamber 4. Then, a process gas A may be injected into a gas inlet 6 of the process chamber 4. The process gas A may include argon.

A power supply may be applied to the physical vapor deposition apparatus 2. The power supply may include a direct current power supply and/or an alternating current power supply. The power supply may excite the process gas A to transform the process gas A into a plasma P. The power supply may be applied to the heater 12, the electrostatic chuck 14, and the target supporting member 19.

The physical vapor deposition apparatus 2 may utilize a voltage difference between the electrostatic chuck 14 and the target supporting member 19 to collide ions of the plasma P with a top surface of the target 18. The ions of the plasma P may separate a part of the deposition source material from the target 18 through the collision with the target 18 along arrows B. Thus, the separated deposition source material may be maintained in an atomic state or a molecular state.

The separated deposition source material may be conformally deposited on the third insulating film 63 as shown in FIG. 11. For example, the separated deposition source material may penetrate the plasma P along arrows C to form a first lower resistance variable film 93 on the third insulating film 63.

The first lower resistance variable film 93 may include germanium/antimony/tellurium (GeSbTe). The first lower resistance variable film 93 may include an amorphous region. The first lower resistance variable film 93 may cover the opening 66 in the third insulating film 63.

A surface energy of the first lower resistance variable film 93 may be higher at a top surface of the third insulating film 63 than at a lower portion of the opening 66. For example, the first lower resistance variable film 93 may have a relatively higher surface energy at the top surface of the third insulating film 63 and/or at an entrance of the opening 66, as compared with a lower portion of the opening 66, in view of a deposition profile.

During the formation of the first lower resistance variable film 93, the plasma P and the heater 12 in the process chamber 4 may heat the first lower resistance variable film 93. Thus, a part of the first lower resistance variable film 93 on the top surface of the third insulating film 63 may be vaporized along arrows E1 and E2.

Elements that are vaporized as described above may have a relatively lower heat of vaporization (among the elements constituting the first lower resistance variable film 93). For example, the heater 12 and the plasma P may heat the first lower resistance variable film 93 to vaporize the elements having the relatively lower heat of vaporization. In an implementation, the vaporized elements may include antimony and tellurium.

The vaporized elements may move from a top surface of the first lower resistance variable film 93 toward a surface having a relatively lower surface energy thereon. In an implementation, the vaporized elements may move from a top surface of the first lower resistance variable film 93 (e.g., on top of the third insulating film 63) toward the lower portion and an interior of the opening 66 to form a first upper resistance variable film 96.

During the formation of the first upper resistance variable film 96, the first upper resistance variable film 96 may react with the first lower resistance variable film 93 on sidewalls and the bottom surface of the opening 66 to form a crystalline region therein. The crystalline region may grow from the lower portion and a central portion of the opening 66 toward an upper portion of the opening 66.

In this case, the first lower and upper resistance variable films 93 and 96 may have different ratios of elements from each other. Thus, a portion of the elements of the first lower resistance variable film 93 may diffuse into the first upper resistance variable film 96 along arrows E3 in the opening 66.

For example, a part of non-vaporized elements of the first lower resistance variable film 93 may diffuse into the first upper resistance variable film 96. Thus, a first region 90 of the first lower resistance variable film 93 may be left in an amorphous region. Second and third regions 91 and 92 of the first lower resistance variable film 93 may be left in a crystalline region. The first lower and upper resistance variable films 93 and 96 may constitute a first resistance variable film 99. Continuously separated deposition source material from the target 18 may be deposited on the first resistance variable film 99.

An exhaust gas D (including non-reactive portions of the process gas as well as a by-product generated through the reaction in the process chamber 4) may be continuously exhausted through a gas outlet 8 of the process chamber 4.

Figure 12A:
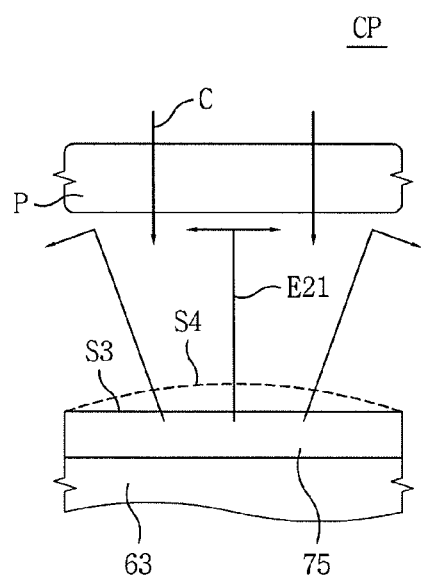

Referring to FIG. 12A, during the formation of the first resistance variable film 99, portions of the first lower resistance variable film 93 on the third insulating film 63 may transform a profile thereof at a check point CP of FIG. 11, as the process of forming the first lower resistance variable film 93 proceeds.

For example, in a first step of forming the first lower resistance variable film 93, a lower resistance variable film 75 may be formed on the third insulating film 63 by separated deposition source material from the target 18 of FIG. 1. A top surface S3 of the lower resistance variable film 75 may have a similar profile to the top surface of the third insulating film 63.

For example, the top surface S3 of the lower resistance variable film 75 may be flat along the top surface of the third insulating film 63. Then, when a portion of elements of the lower resistance variable film 75 are vaporized along arrows E21, the lower resistance variable film 75 may exhibit a lowered surface energy at the top surface S3 thereof.

Accordingly, the lower resistance variable film 75 may have a top surface S4 having a curvature during the formation of the first lower resistance variable film 93.

Figure 12B:
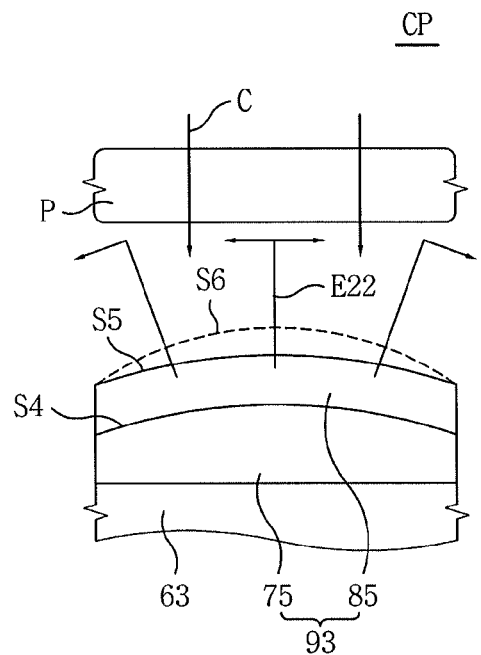

Referring to FIG. 12B, at the check point CP of FIG. 11, in a second step of forming the first lower resistance variable film 93, an upper resistance variable film 85 may be formed on the top surface of the third insulating film 63 by a continuously separated deposition source material from the target 18 of FIG. 1. A top surface S5 of the upper resistance variable film 85 may have a similar profile to the top surface S4 of the lower resistance variable film 75.

When a portion of elements of the upper resistance variable film 85 is vaporized along arrows E22, a top surface S6 of the upper resistance variable film 85 may have a smaller radius of curvature than that of the lower resistance variable film 75. The upper resistance variable film 85 together with the lower resistance variable film 75 may constitute the first lower resistance variable film 93.

Figure 12C:
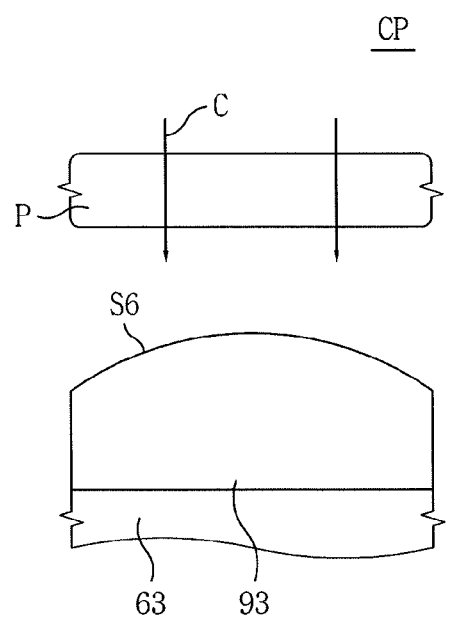

Referring to FIG. 12C, at the check point CP of FIG. 11, the first lower resistance variable film 93 may also be formed through more than three steps similar to the first and second steps. When formed through more than three steps, the top surface S6 of the first lower resistance variable film 93 may transform even more closely to a surface of a spherical shape.

Figure 13:
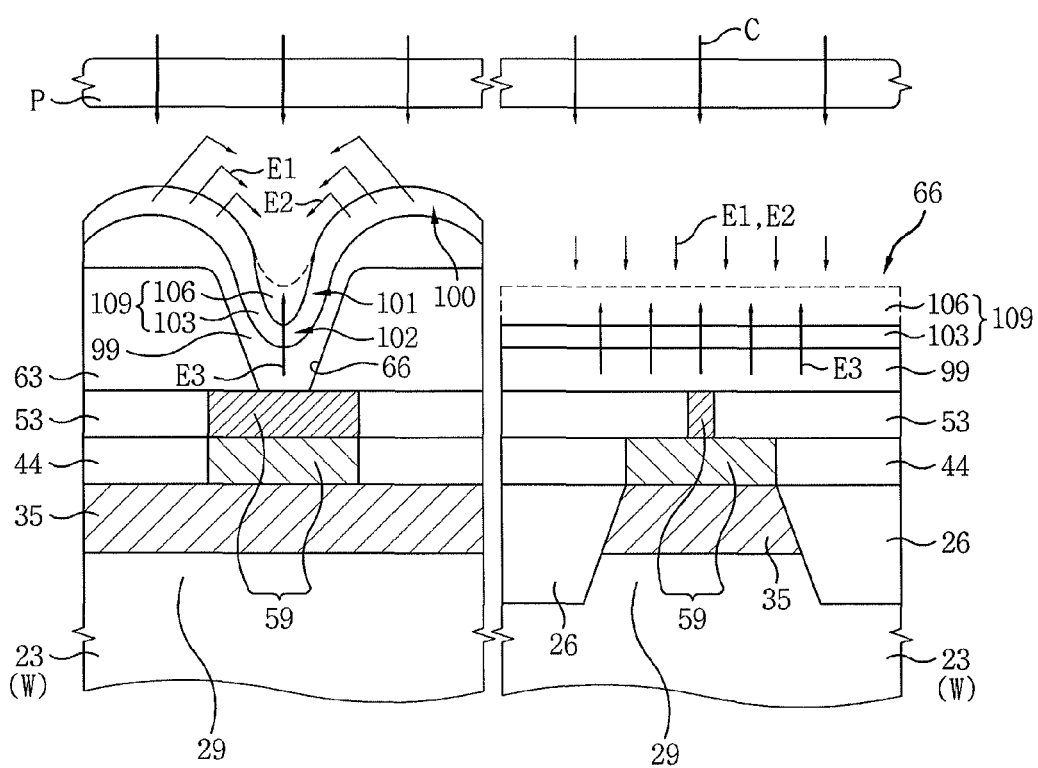

Referring to FIG. 13, a second lower resistance variable film 103 may be formed on the first resistance variable film 99. The second lower resistance variable film 103 may be formed through the same process as the first resistance variable film 99, by referring to FIGS. 11 and 12A to 12C. The second lower resistance variable film 103 may conformally cover the first resistance variable film 99.

As described with respect to FIGS. 11 and 12A to 12C, a portion of elements of the second lower resistance variable film 103 may be vaporized on the top surface of the third insulating film 63 along the arrows E1 and E2 to move toward the lower portion and the interior of the opening 66.

The vaporized and moved elements may be stacked on a top surface of the second lower resistance variable film 103 to form a second upper resistance variable film 106 in the opening 66. During the formation of second upper resistance variable film 106, the second upper resistance variable film 106 may react with the second lower resistance variable film 103 on sidewalls and the central region of the opening 66 to form a crystalline region therein.

Thus, a first region 100 of the second lower resistance variable film 103 may be left in an amorphous region. Second and third regions 101 and 102 of the second lower resistance variable film 103 may be left in a crystalline region. The second lower and upper resistance variable films 103 and 106 may constitute a second resistance variable film 109.

During the formation of the second resistance variable film 109, the second resistance variable film 109 may show the same trend or phenomenon as illustrated in FIGS. 12A to 12C on the top surface of the third insulating film 63.

Figure 14:
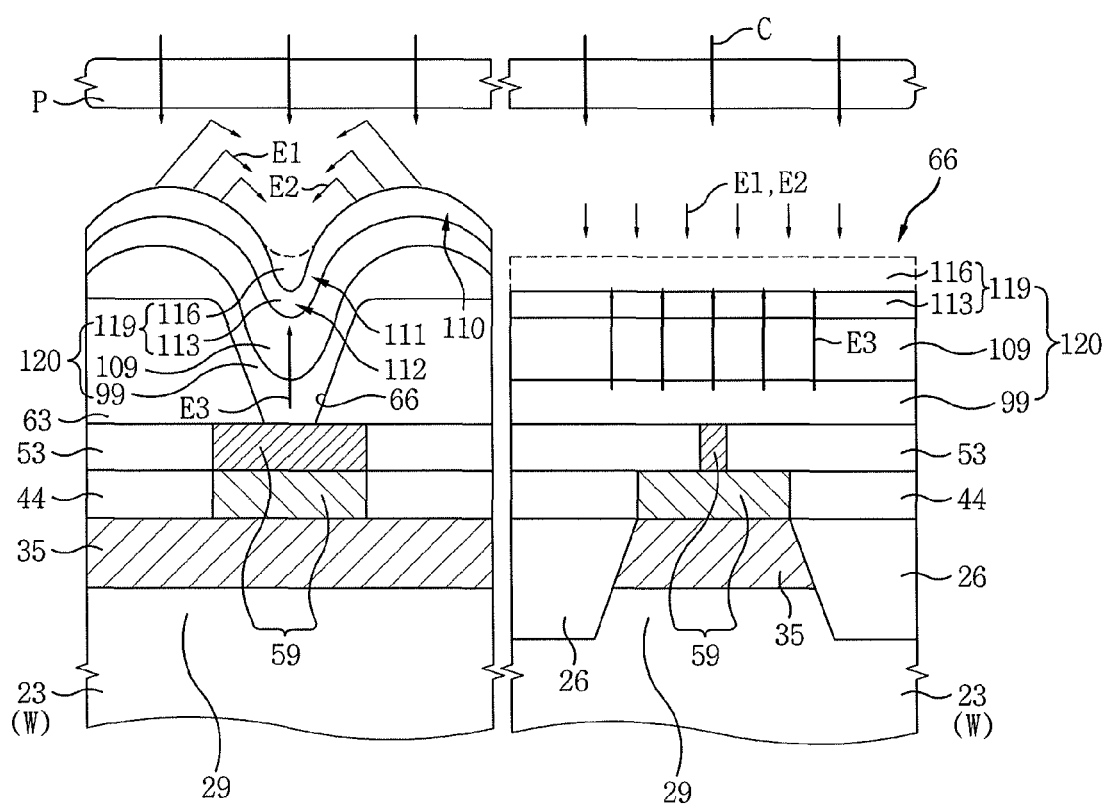

Referring to FIG. 14, a third lower resistance variable film 113 and a third upper resistance variable film 116 may be formed on the second resistance variable film 109. The formation of the third lower and upper resistance variable films 113 and 116 may be understood by referring FIGS. 11, 12A to 12C, and 13.

Thus, a first region 110 of the third lower resistance variable film 113 may be left in an amorphous region. Second and third regions 111 and 112 of the third lower resistance variable film 113 may be left in a crystalline region. The third lower and upper resistance variable films 113 and 116 may constitute a third resistance variable film 119.

The third resistance variable film 119 together with the first and second resistance variable films 99 and 109 may constitute a resistance variable film 120. The resistance variable film 120 may include a phase-change film. After the formation of the resistance variable film 120, operation of the physical vapor deposition apparatus 2 of FIG. 1 may stop. The semiconductor substrate 23 (W) including the resistance variable film 120 may be separated from the physical vapor deposition apparatus 2. In an implementation, the first, second, and third resistance variable films 99, 109, and 119 may not be flowed therefrom when considering all aspects of volume flow.

In an implementation, the formation of the first, second, and third resistance variable films 99, 109, and 119 may be performed at a lower temperature than a temperature capable of being flowed. For example, when the first to third resistance variable films 99, 109, and 119 include germanium, antimony, and tellurium, the first to third resistance variable films 99, 109, and 119 may be flowed at a temperature above about 600° C. when considering all aspects of volume flow.

However, the formation of the first, second, and third resistance variable films 99, 109, and 119 according to an embodiment may be performed at a temperature of less than about 350° C. In an implementation, the formation of the first, second, and third resistance variable films 99, 109, and 119 may be performed at a temperature of less than about 320° C. Generally, a volume-flow process using universal gravitation may transform an original profile of a material into a new profile of the material, even and with similar atomic bonds throughout the whole portion of the material.

However, a part of elements of each of the first, second, and third resistance variable films 99, 109, and 119 may be continuously left in its film during the formation of the respective first, second, and third resistance variable films 99, 109, and 119. The remaining part of the elements may be vaporized from the film and may move along a top surface of the film during the formation of the respective first, second, and third resistance variable films 99, 109, and 119. Accordingly, as shown in FIGS. 12A to 12C, a surface profile of the respective first, second, and third resistance variable films 99, 109, and 119 may be changed to a direction lowering the surface energy thereof. Each of the first, second, and third resistance variable films 99, 109, and 119 may have different atomic bonds from each other along its surface.

For example, when the first, second, and third resistance variable films 99, 109, and 119 include germanium, antimony, and tellurium, their respective crystalline regions may have an atomic bond or crystal structure of $Ge_2Sb_2Te_5$ and may show a uniform elemental concentration, and their respective amorphous regions may have a smaller or larger elemental concentration with respect to a specific element.

In an implementation, maintaining the pressure of the process chamber 4 at less than about 1 mTorr may help ensure that the resistance variable film 120 is excellently formed. The resistance variable film 120 may be formed at a pressure of about 0.5 mTorr. When the pressure of the process chamber 4 is lowered, vaporization of a deposited material may become increasingly accelerated; and a desired result may be expected to be obtained. In an implementation, the pressure of the process chamber 4 may be lowered to about 0.1 mTorr.

The physical vapor deposition apparatus 2 may have a special configuration for embodying the embodiments. For example, in order to obtain the first, second, and third resistance variable films 99, 109, and 119 having purer deposited material and an excellent deposition profile, a distance L between the target 18 and the semiconductor substrate 23 (W) in FIG. 1 may be sufficiently increased.

Instead of spacing the target only tens of millimeters away from the semiconductor substrate, the target 18 may be spaced hundreds of millimeters away from the semiconductor substrate 23 (W) in the physical vapor deposition apparatus 2 according to an embodiment. For example, the target 18 may be spaced about 200 to about 600 mm away from the semiconductor substrate 23 (W) in the physical vapor deposition apparatus 2.

In an implementation, the target 18 may be spaced to about 400 mm away from the semiconductor substrate 23 (W) in the physical vapor deposition apparatus 2. As the distance L increases in size, the separated deposition source material from the target 18 may have more elements moving in straight lines. In addition, the deposition source material separated from the target 18 may be deposited in a relatively larger amount on the semiconductor substrate 23 (W).

Elements separated from the target 18 and not moving in the straight lines may be scattered by a magnetic wave and plasma ions in the process chamber to advantageously deposit in only a relatively smaller amount on the semiconductor substrate 23 (W).

In an implementation, the resistance variable film 120 may be formed by using a plasma enhanced chemical vapor deposition (PECVD) apparatus. In this case, a process chamber of the PECVD apparatus may not have a target including a deposition source material as shown in FIG. 1.

The process chamber of the PECVD apparatus may have a pressure of about 0.1 mTorr to about 1.0 mTorr. A heater of the process chamber in the PECVD apparatus may have or provide a temperature of about 260° C. to about 350° C. In an implementation, the temperature may be about 320° C.

A process gas of the PECVD apparatus may include a deposition source material. During operation of the PECVD apparatus, the deposition source material may be transformed into a plasma on a semiconductor substrate, which is in the process chamber.

In another implementation, the deposition source material may not include a chalcogen element. In this case, the deposition source material may include at least one element having heat of vaporization greater than about 0.4 kJ/mol. Accordingly, the deposition source material may include one element containing group or a plurality of elements containing group.

In yet another implementation, after the formation of the resistance variable film 120, the semiconductor substrate 23 (W) including the resistance variable film 120 may also be heat-treated. The heat treatment may be performed through a rapid thermal anneal (RTA) equipment.

Figure 15:
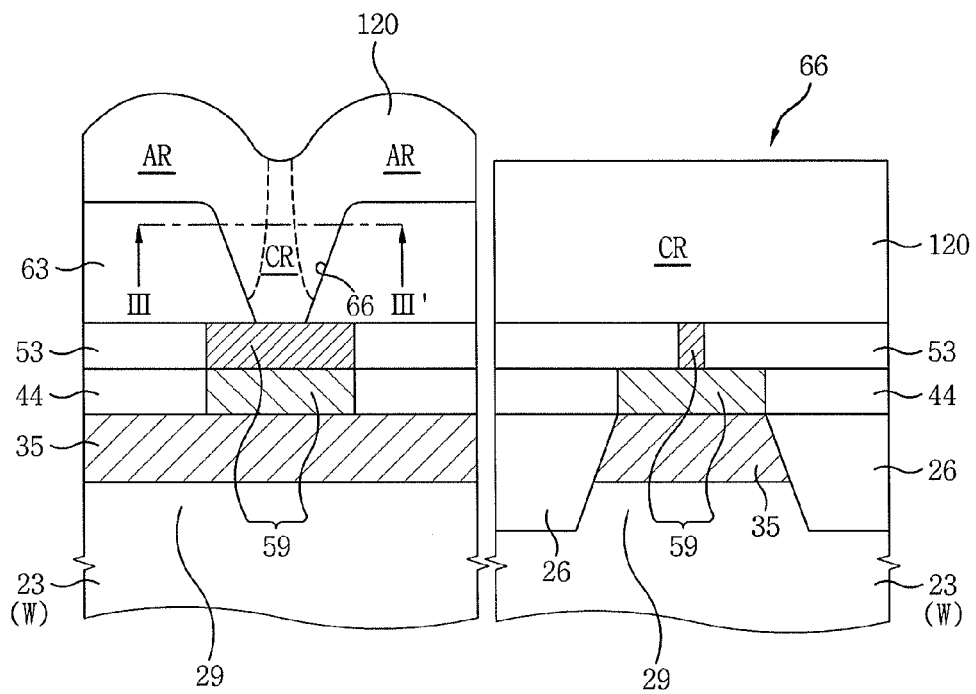

Referring to FIG. 15, the resistance variable film 120 may include amorphous regions AR and a crystalline region CR (through the reaction of the first to third resistance variable films 99, 109, and 119 in FIGS. 11, 13, and 14). The amorphous regions AR may be formed to adjoin or be adjacent to the sidewalls of the opening 66 and/or on the top surface of the third insulating layer 63.

The crystalline region CR may be formed to have a tapered shape (with a width of an upper portion being smaller than that of a lower portion according to a central axis of the opening 66). In this case, the resistance variable film 120 may have different elemental concentrations in the amorphous regions AR and the crystalline region CR.

For example, the resistance variable film 120 may be formed through vaporization and/or diffusion of elements during the formation of the first to third resistance variable films 99, 109, and 119. For checking the above, the resistance variable film 120 may be analyzed along a line III-III' of FIG. 15.

Figure 31A:
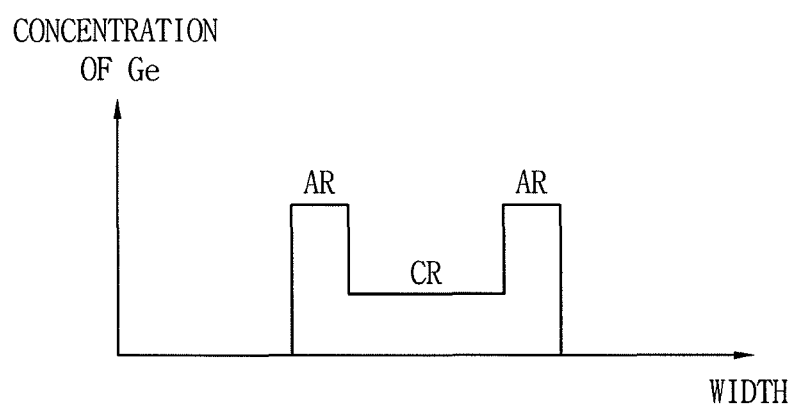
FIGS. 31A and 31B illustrate graphs showing elemental concentration in a resistance variable pattern, taken along a line III-III' of FIG. 15.
Figure 31B:
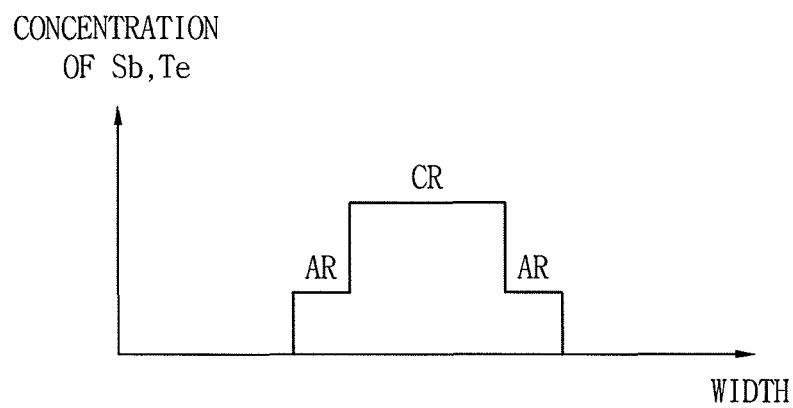

FIGS. 31A and 31B illustrate graphs showing elemental concentration in a resistance variable pattern, taken along a line III-III' of FIG. 15. A component analysis of the resistance variable film 120 in FIGS. 31A and 31B show the vaporization and/or the diffusion of the elements during the formation of the first to third resistance variable films 99, 109, and 119. Accordingly, due to the vaporization and/or the diffusion of the elements, the different elemental concentrations may occur in the amorphous regions AR and the crystalline region CR.

The component analysis of the resistance variable film 120 will be further described in FIGS. 31A and 31B.

Figure 16:
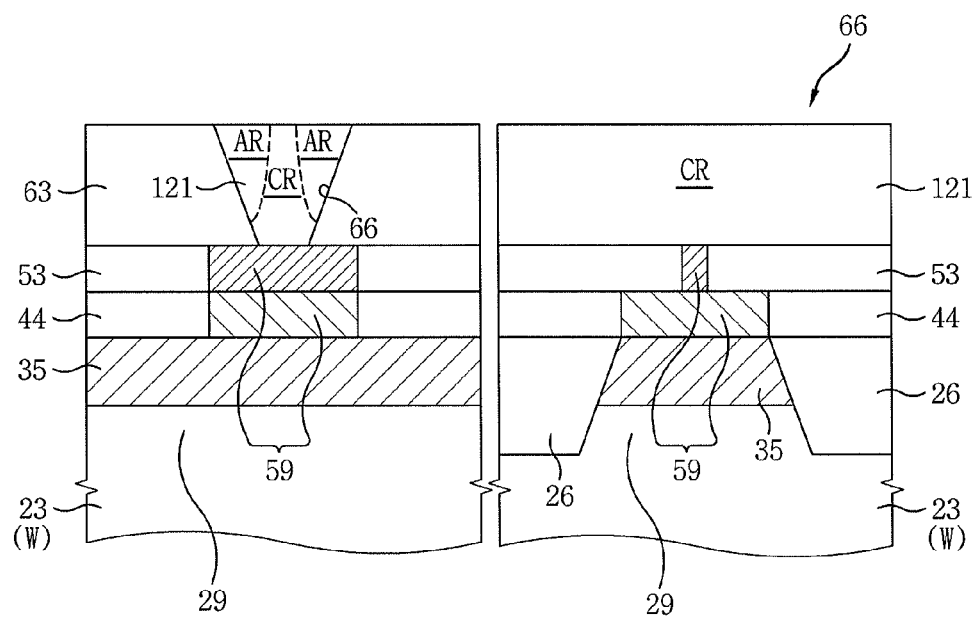

Referring to FIG. 16, the resistance variable film 120 of FIG. 15 may be planarized by using a chemical mechanical polishing (CMP) process until the top surface of the third insulating layer 63 is exposed, thereby forming a resistance variable pattern 121. The resistance variable pattern 121 may be confined to the opening 66.

The resistance variable pattern 121 may have amorphous regions AR and a crystalline region CR. When viewed in a plan view, the crystalline region CR may be in a center or a central region of the opening 66 in FIG. 2.

When viewed in a cross-sectional view, the crystalline region CR in FIG. 16 may be between a top surface of the resistance variable pattern 121 and the bottom surface of the opening 66. The amorphous regions AR in FIG. 16, when viewed in the cross-sectional view, may define the crystalline region CR by situating on the sidewalls of the opening 66.

Figure 17:
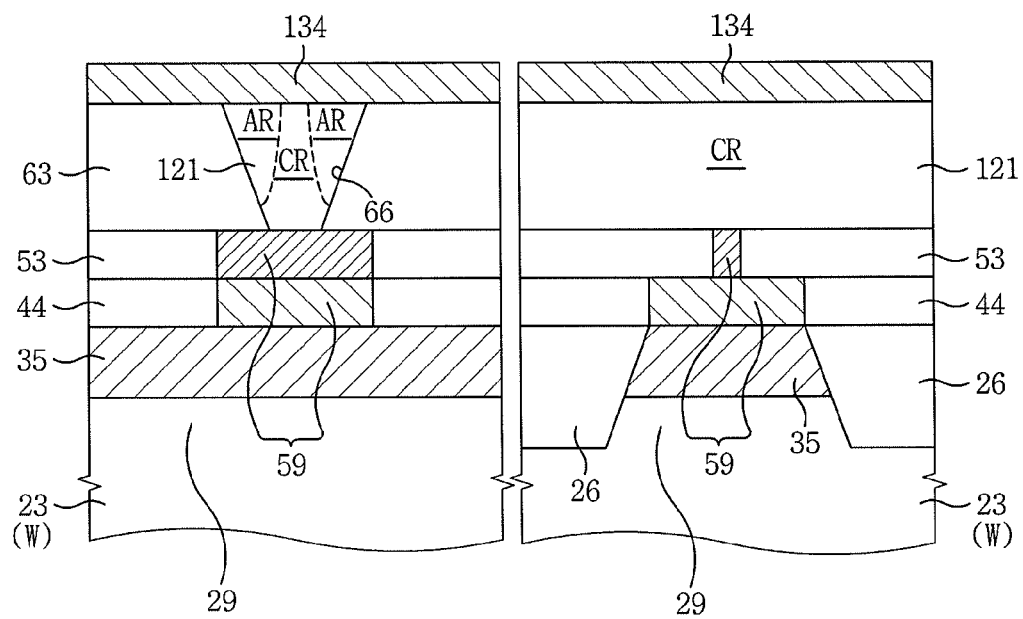

Referring to FIG. 17, a first conductive film 134 may be formed on the third insulating film 63 and the resistance variable pattern 121. The first conductive film 134 may cover the third insulating film 63 and the resistance variable pattern 121. The first conductive film 134 may include a metal.

Figure 18:
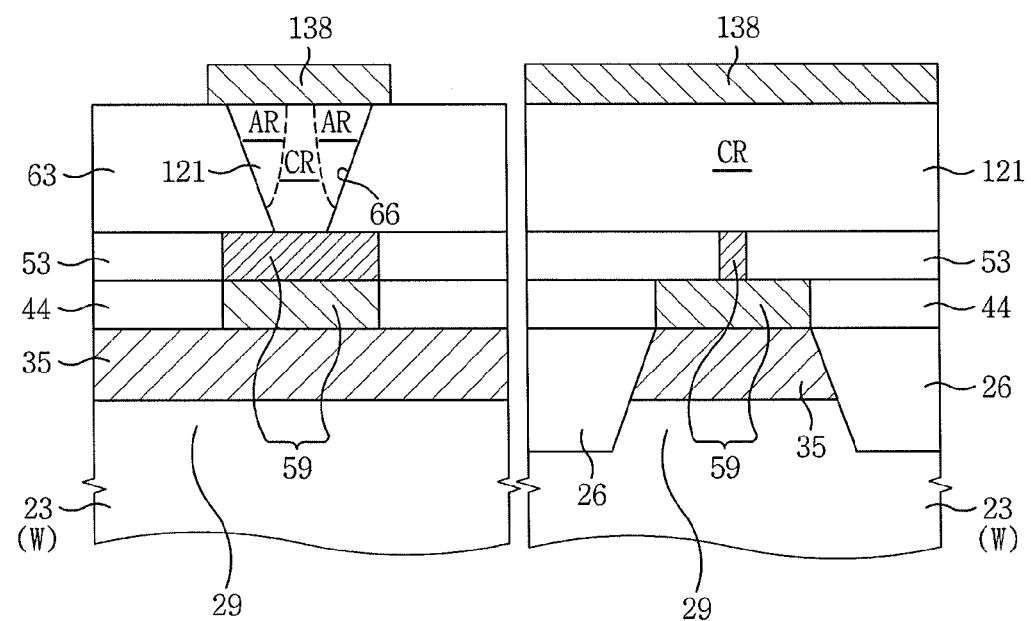

Referring to FIG. 18, the first conductive film 134 may be patterned, thereby exposing portions of the third insulating film 63 to form an upper electrode 138 on the resistance variable pattern 121. The upper electrode 138 may cover the resistance variable pattern 121.

The upper electrode 138 may be formed on the opening 66 in FIG. 2. A width of the upper electrode 138 may be larger than that of an upper portion of the resistance variable pattern 121.

Figure 19:
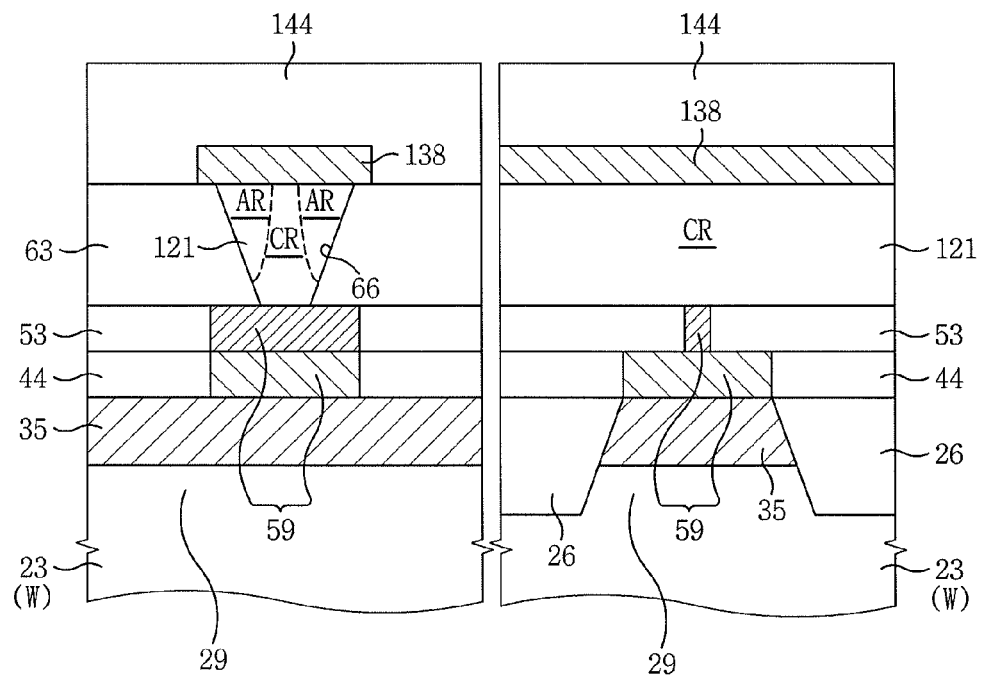

Referring to FIG. 19, a fourth insulating film 144 may be formed on the third insulating film 63. The fourth insulating film 144 may cover the upper electrode 138. The fourth insulating film 144 may include an insulating material having the same etch rate as, or a different etch rate from, the third insulating film 63.

Figure 20:
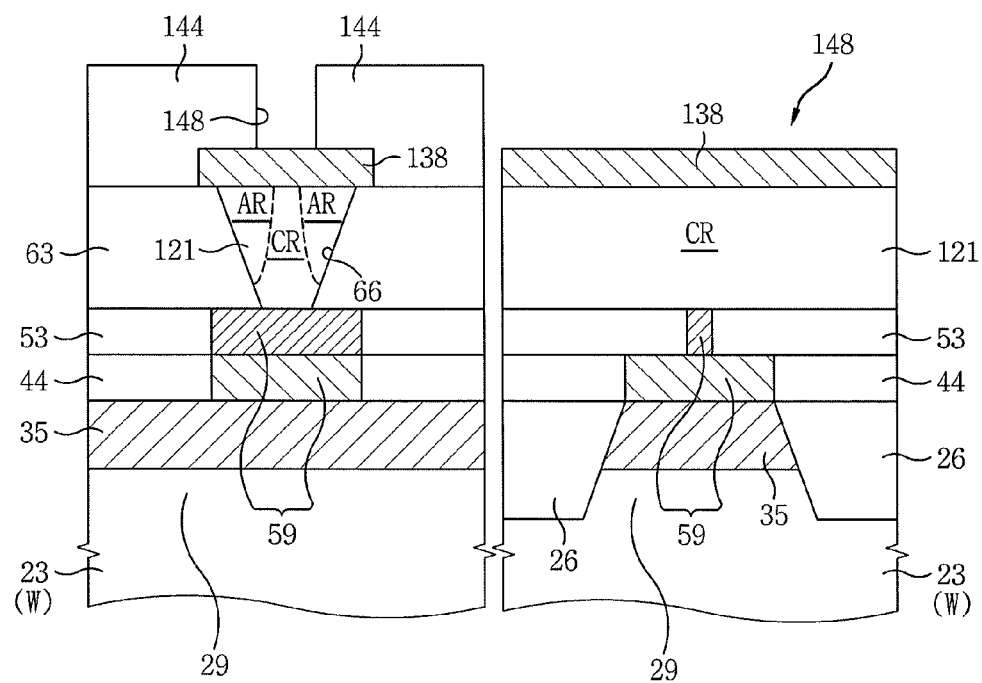

Referring to FIG. 20, a through hole 148 may be formed in the fourth insulating film 144. The through hole 148 may expose portions of the upper electrode 138.

Figure 21:
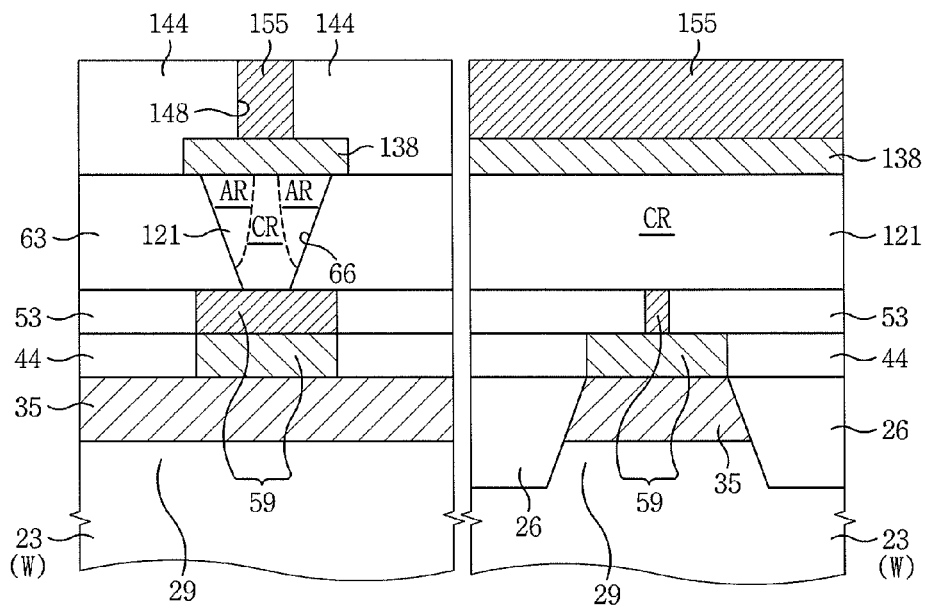

Referring to FIG. 21, a plug 155 may be formed in the through hole 148. The plug 155 may sufficiently fill the through hole 148. The plug 155 may include a material different from the upper electrode 138. For example, the plug 155 may include a metal and/or a metal nitride. The plug 155 may be in contact with the upper electrode 138 through the through hole 148.

Figure 22:
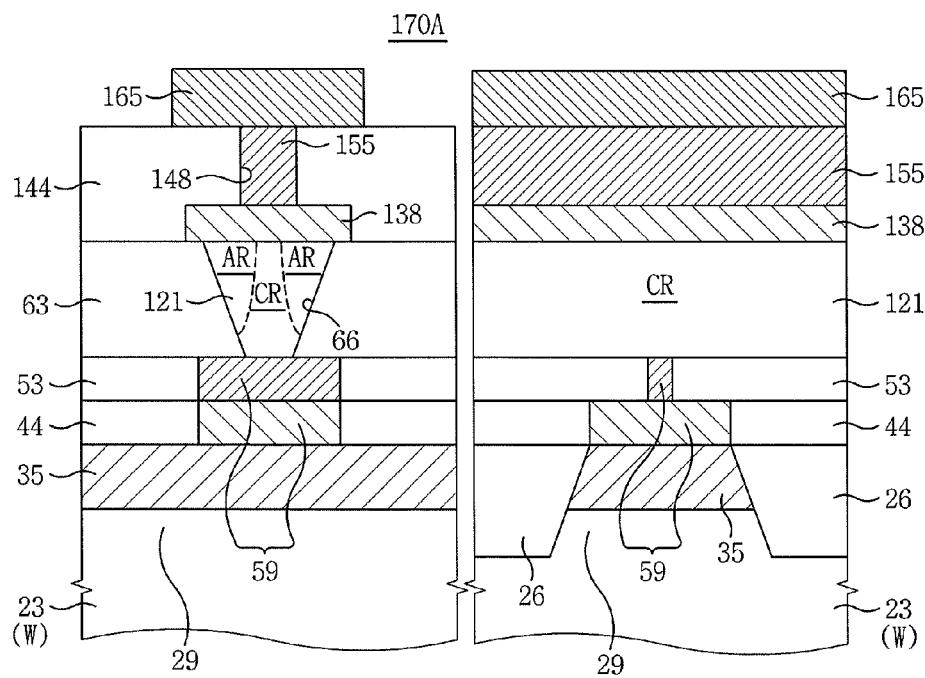

Referring to FIG. 22, a bit line 165 may be formed on the fourth insulating film 144. The bit line 165 may cover the plug 155. The bit line 165 may be formed along the opening 66 in FIG. 2.

The bit line 165 together with the semiconductor substrate 23 (W), the selective device 59, the resistance variable pattern 121, and the upper electrode 138 may constitute a resistance variable memory device 170A.

Figure 23:
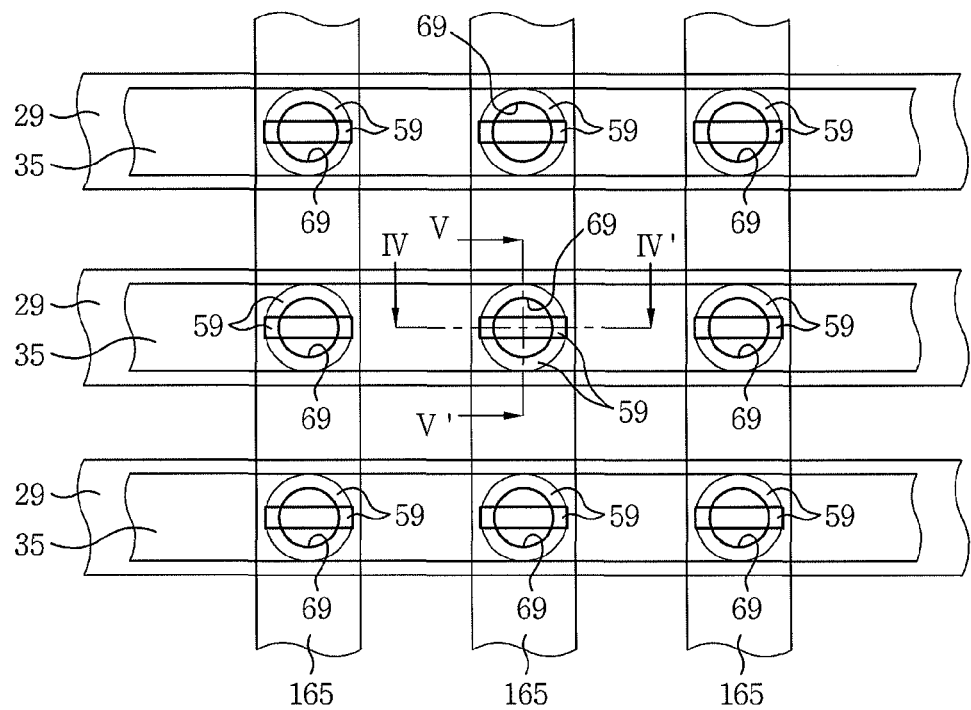
FIG. 23 illustrates a layout view showing a resistance variable memory device according to another embodiment.

FIG. 23 illustrates a layout view of a resistance variable memory device according to another embodiment. FIGS. 24 to 29 illustrate cross-sectional views taken along lines IV-IV' and V-V' of FIG. 23, showing stages in a method of forming the resistance variable memory device of FIG. 23.

FIGS. 23 to 29 utilize like reference numerals for like members as shown in FIGS. 2 to 22.

Referring to FIG. 23, a resistance variable memory device 170B according to the present embodiment may have a similar structure to the device illustrated in FIG. 2. However, the resistance variable memory device 170B may have openings 69, which are different from FIG. 2. When viewed in a plan view, each of the openings 69 may have a circular shape. The respective openings 69 may be filled with a resistance variable pattern 123 (see FIG. 28).

Figure 24:
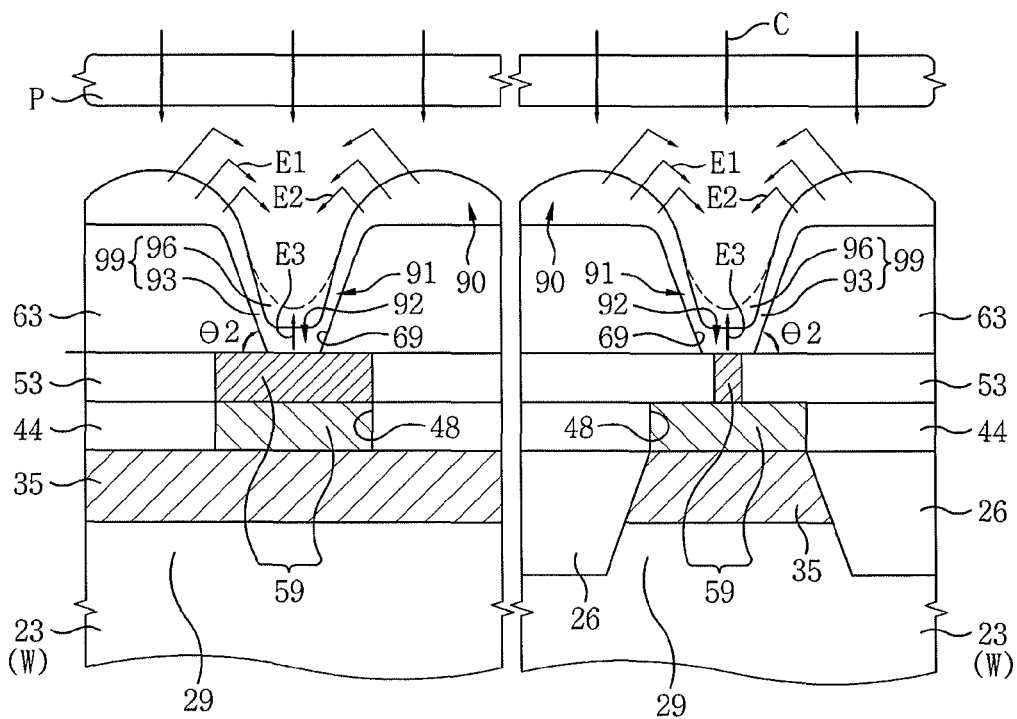
FIGS. 24 to 29 illustrate cross-sectional views taken along lines IV-IV' and V-V' of FIG. 23, showing stages in a method of forming the resistance variable memory device of FIG. 23.

Referring to FIG. 24, the opening 69 may be formed in the third insulating film 63 of FIG. 9. A plurality of the openings 69 may be formed in order to correspond to each of selective devices 59 of FIG. 23. When viewed in a plan view, the opening 69 may expose the corresponding selective device 59 in FIG. 23.

Sidewalls of the opening 69 may have an inclined angle θ2 with respect to a top surface of the selective device 59 and/or a top surface of a second insulating layer 53. The inclined angle θ2 of the sidewalls of the opening 69 may be the same as or different from the inclined angle θ1 of the opening 66 in FIG. 10.

The sidewall of the opening 69 may extend to a top surface of the third insulating film 63. A surface or corner between the top surface of the third insulating film 63 and the sidewall of the opening 69 may have a predetermined radius of curvature, e.g., may be rounded. The radius of curvature may be the same size as or a different size from the radius R of curvature in FIG. 10.

A semiconductor substrate 23 (W) (including the third insulating film 63 thereon) may be inserted into the process chamber 4 of the physical vapor deposition apparatus 2 of FIG. 1. Hereafter, processes similar to those described with respect to FIG. 11 may be performed to form a first resistance variable film 99 on the third insulating film 63.

Figure 25:
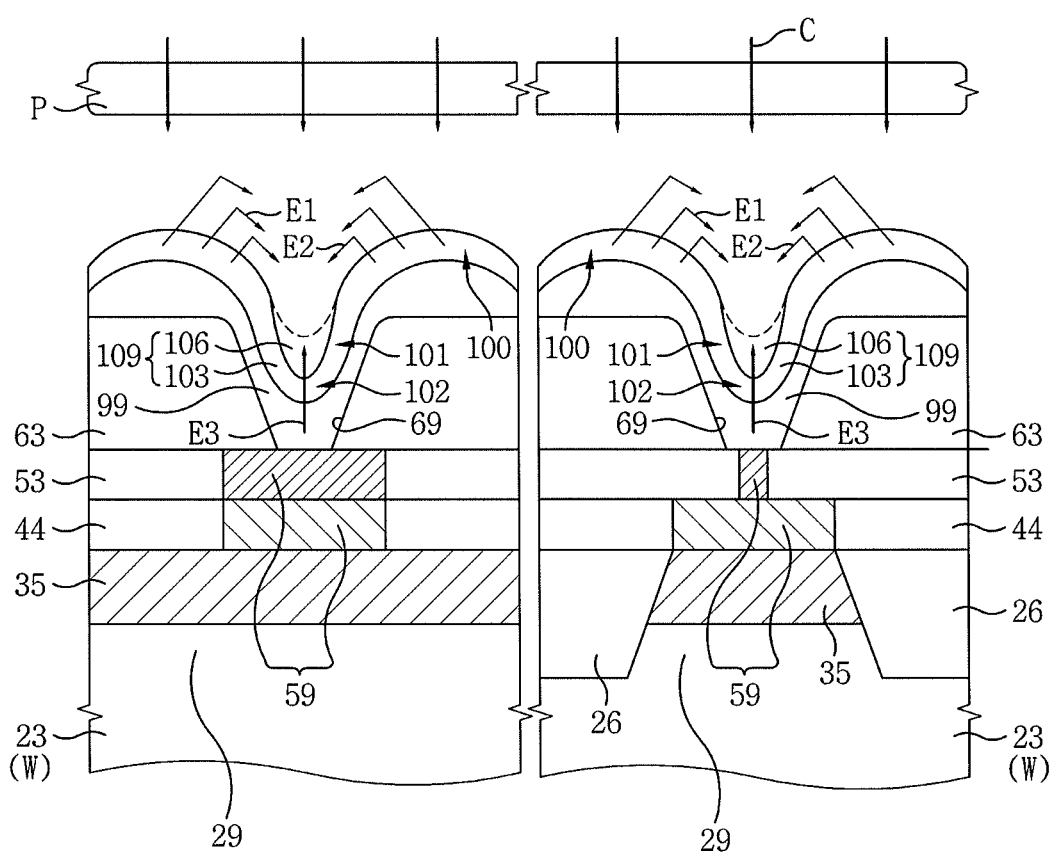

Referring to FIG. 25, subsequent processes (similar to those described with respect to FIG. 13) may be performed to form a second resistance variable film 109 on the first resistance variable film 99.

Figure 26:
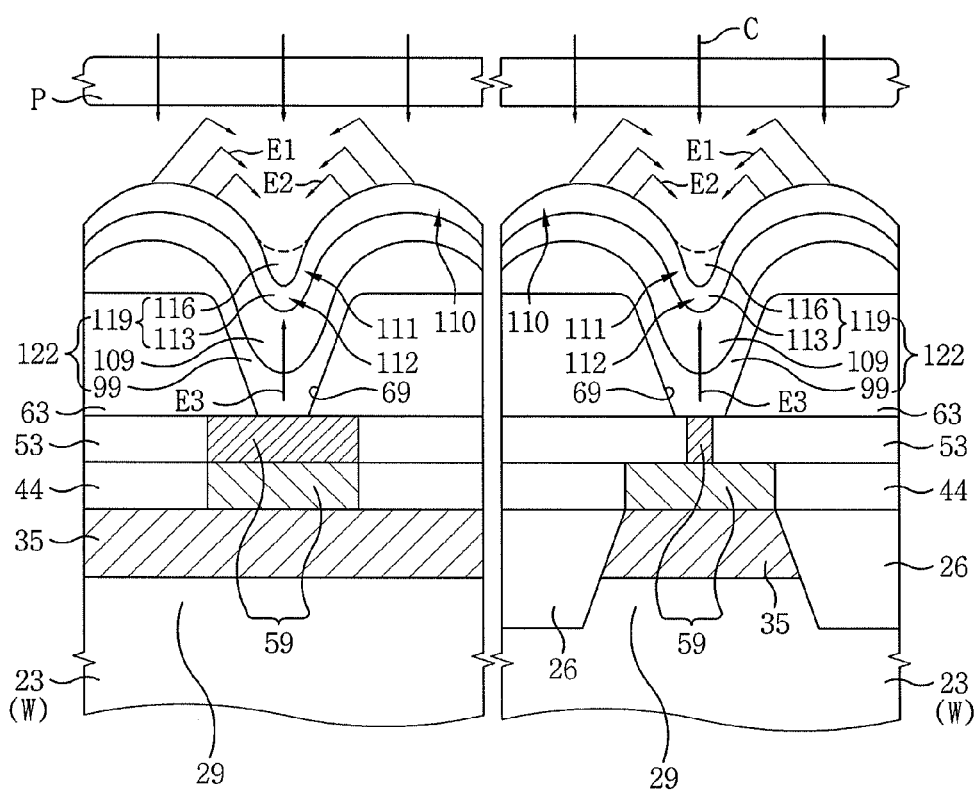

Referring to FIG. 26, continuous processes (similar to those described with respect to FIG. 14) may be performed to form a third resistance variable film 119 on the second resistance variable film 109. In this case, the third resistance variable film 119 together with the first resistance variable film 99 and the second resistance variable film 109 may constitute a resistance variable film 122. The resistance variable film 122 may include a phase-change film.

Figure 27:
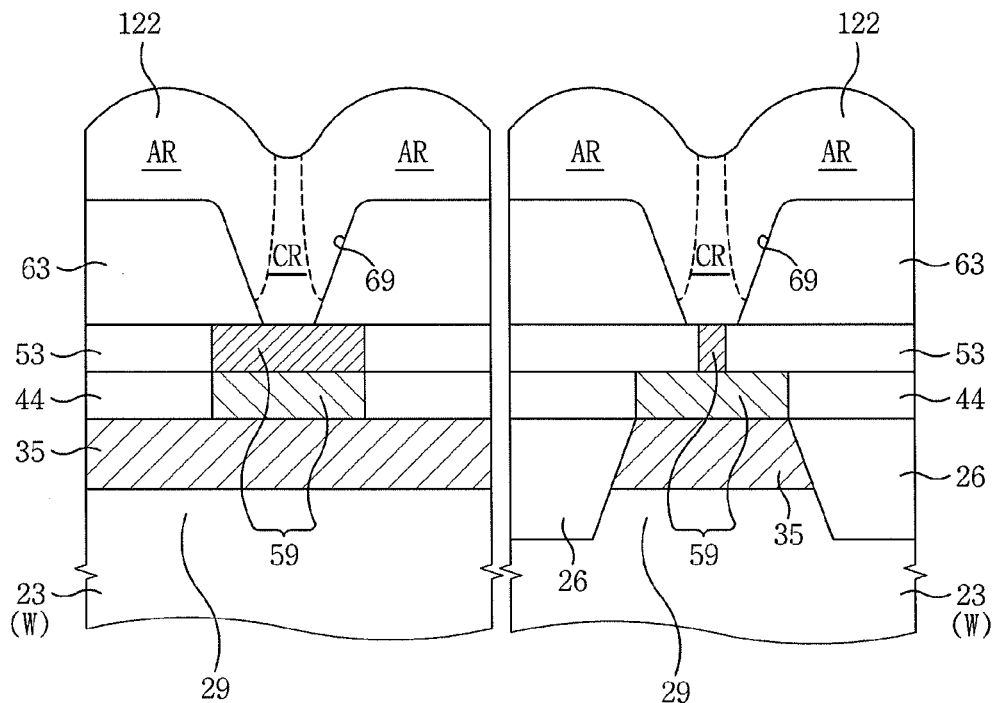

Referring to FIG. 27, the resistance variable film 122 may include an amorphous region AR and a crystalline region CR, similar to FIG. 15. The amorphous region AR may be formed to adjoin or be adjacent to the sidewall of the opening 69 and/or on the top surface of the third insulating layer 63.

The crystalline region CR may have a tapered shape (with a width of an upper portion being smaller than a lower portion according to a central axis of the opening 69). In this case, the resistance variable film 122 may have different elemental concentrations in the amorphous region AR and the crystalline region CR.

Alternatively, the resistance variable film 122 may be formed by using the PECVD apparatus described above. The resistance variable film 122 may also be formed by using the deposition source material described above.

Figure 28:
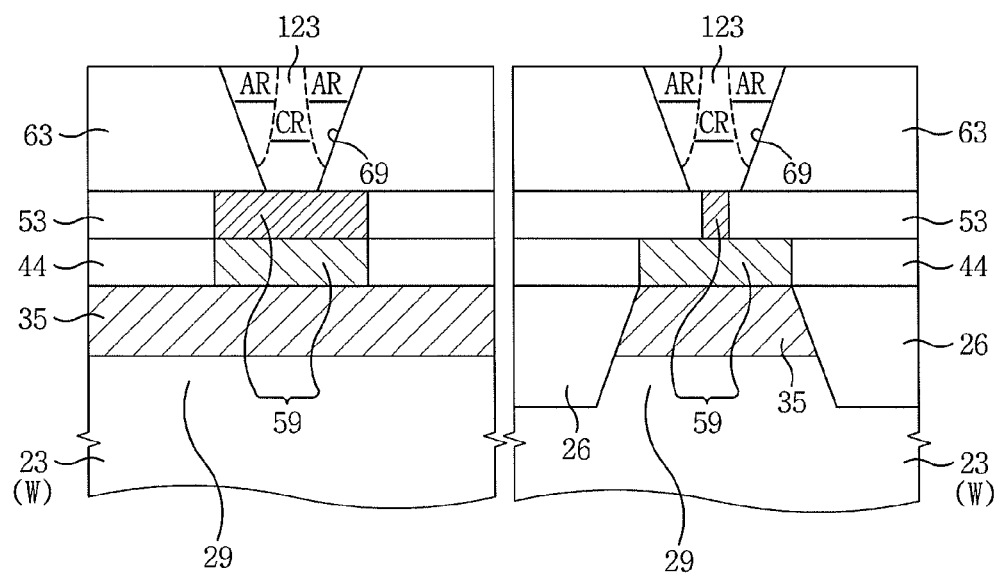

Referring to FIG. 28, the resistance variable film 122 may be planarized until exposing the top surface of the third insulating film 63 to form a resistance variable pattern 123 in the opening 69. The resistance variable pattern 123 may be confined to the corresponding opening 69. The resistance variable pattern 123 may have an amorphous region AR and a crystalline region CR, which originate from the resistance variable film 122.

Figure 29:
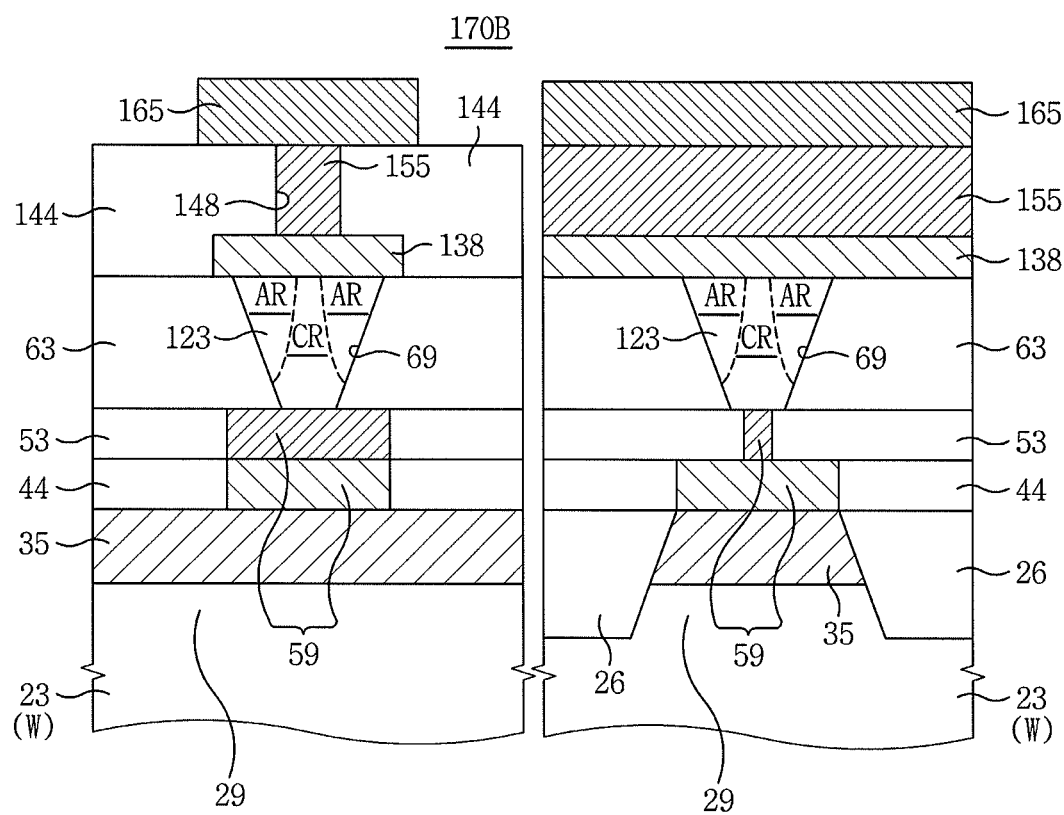

Referring to FIG. 29, an upper electrode 138 may be formed on the third insulating film 63. The upper electrode 138 may expose portions of the third insulating film 63. A fourth insulating film 144 may be formed on the third insulating film 63 and the upper electrode 138.

A through hole 148 may be formed in the fourth insulating film 144. The through hole 148 may expose portions of the upper electrode 138. A plug 155 may be formed in the through hole 148. A bit line 165 may be formed on the fourth insulating film 144 and the plug 155.

Accordingly, the bit line 165 together with the semiconductor substrate 23 (W), the selective device 59, the resistance variable pattern 123, and the upper electrode 138 may constitute the resistance variable memory device 170B.

FIGS. 30A to 30D illustrate enlarged schematic views showing stages in the method of forming the resistance variable memory device according to an embodiment. In this case, FIGS. 30A to 30D use like reference numerals for like elements as shown in FIGS. 2 to 22.

Figure 30A:
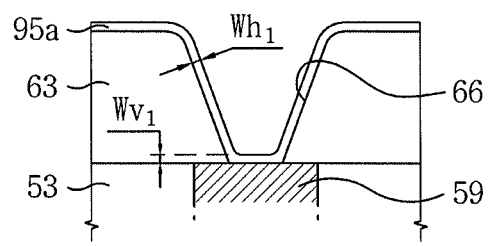
FIGS. 30A to 30D illustrate enlarged schematic views showing stages in the method of forming the resistance variable memory device according to an embodiment.

Referring to FIG. 30A, a first filling material 95a may be formed to a first horizontal thickness Wh1 and a first vertical thickness Wv1 in the opening 66 of FIG. 10. The first horizontal thickness Wh1 may be substantially the same size as or a similar size to the first vertical thickness Wv1. For example, the first filling material 95a may be conformally deposited on a third insulating film 63 and in the opening 66. In an implementation, the first horizontal thickness Wh1 may be about 300 Å.

Figure 30B:
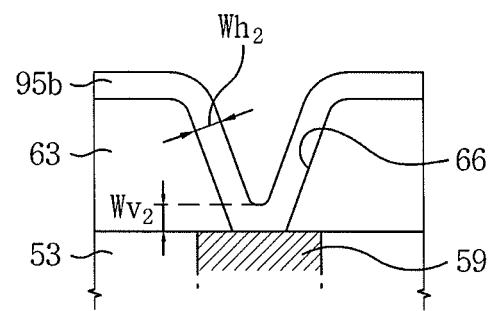

Referring to FIG. 30B, through at least one subsequent deposition process, the first filling material 95a may be transformed into a second filling material 95b (which has a second horizontal thickness Wh2 and a second vertical thickness Wv2) in the opening 66. The second horizontal thickness Wh2 may also be substantially the same size as or a similar size to the second vertical thickness Wv2.

For example, the second filling material 95b may be conformally deposited on the third insulating film 63 and in the opening 66. The second horizontal thickness Wh2 may be about 500 Å. In FIGS. 30A and 30B, the first and second vertical thicknesses Wv1 and Wv2 may refer to thicknesses on the third insulating film 63 after the formation of the first and second filling materials 95a and 95b. The first and second horizontal thicknesses Wh1 and Wh2 may refer to thicknesses on the sidewalls of the opening 66 after the formation of the first and second filling materials 95a and 95b.

Figure 30C:
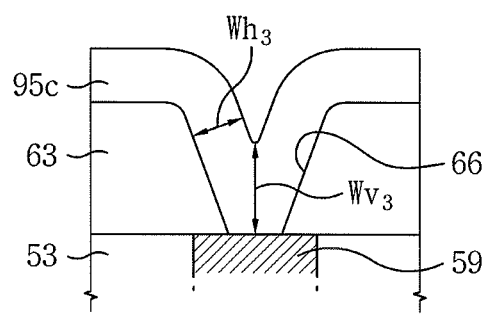

Referring to FIG. 30C, through at least one continuous deposition process, the second filling material 95b may be transformed into a third filling material 95c (which has a third horizontal thickness Wh3 and a third vertical thickness Wv3) in the opening 66. The third horizontal thickness Wh3 may be sufficiently smaller than the third vertical thickness Wv3. For example, the third filling material 95c may have an excellent filling characteristic with respect to the opening 66.

The third horizontal thickness Wh3 may be about 700 Å. In view of FIGS. 30B and 30C, a filling process of a filling material in the opening 66 may facilitate vaporization and diffusion of a part of elements constituting the material to occur actively in a specific thickness of the material. In this case, some of the elements may be diffused into an interior of the opening 66 to react with an underlying film and may be condensed on the underlying film.

When the filling process according to an embodiment is applied to a variety of practical semiconductor uses, a specific thickness of the material may vary according to a process condition of the filling process. As such, the third vertical thickness Wv3 may be a vertical thickness of the third filling material 95c on the interior of the opening 66; and the third horizontal thickness Wh3 may be a horizontal thickness of the third filling material 95c on the sidewall of the opening 66.

Figure 30D:
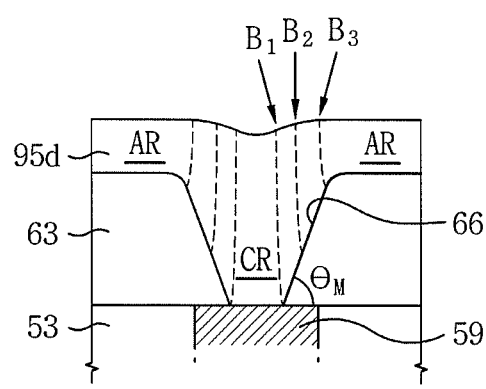

Referring to FIG. 30D, through at least one remaining process, the third filling material 95c may subsequently be transformed into a fourth filling material 95d. The fourth filling material 95d may include amorphous regions AR and a crystalline region CR. The amorphous regions AR and the crystalline region CR may be formed to have a variety of volumes according to a process condition of a filling process. For example, the crystalline region CR may be formed to have a tapered shape, the width of which may be enlarged from a lower portion of the opening 66 to an upper portion thereof.

Boundary surfaces B1, B2, or B3 between the amorphous regions AR and the crystalline region CR may be variously formed. The boundary surfaces B1, B2, or B3 may not be formed vertically, and may have a trend to get closer to verticality. For example, the boundary surfaces B1, B2, or B3 may be variously located from the lower portion of the opening 66 to the upper portion thereof according to a process condition of the filling process.

Also, a location of the boundary surfaces B1, B2, or B3 may vary in the fourth filling material 95d according to an inclined angle $\theta_M$ of the sidewall of the opening 66 with respect to a top surface of a selective device 59 and/or a top surface of a second insulating layer 53. For example, as the inclined angle $\theta_M$ gets closer to a right angle, the boundary surfaces B1, B2, or B3 may be located in a central region of the sidewall of the opening 66.

In this case, the crystalline region CR may have a wider cross-sectional area and/or a larger volume in the lower portion of the opening 66 than in the upper portion of the opening 66.

FIGS. 31A and 31B illustrate graphs showing elemental concentration in a resistance variable pattern, taken along a line III-III' of FIG. 15.

Referring to FIGS. 31A and 31B, the resistance variable film 120 of FIG. 15 was analyzed along a line III-III' of FIG. 15. In this case, an elemental concentration of the resistance variable film 120 was measured by using a transmission electron microscope energy dispersive spectrometer (TEMEDS).

In FIG. 31A, the X axis represents a width of a cross section of the third insulating film 63 and the opening 66 along the line III-III' of FIG. 15; and the Y axis represents a concentration of germanium. The resistance variable film 120 including germanium/antimony/tellurium (GeSbTe) was measured.

The concentration of germanium was greater in amorphous regions AR of the resistance variable film 120 than in a crystalline region CR of the resistance variable film 120. This may be because the germanium may not relatively vaporize and/or diffuse from the amorphous regions AR of the resistance variable film 120, as compared with the antimony and tellurium.

In FIG. 31B, the X axis represents a width of a cross section of the third insulating film 63 and the opening 66 along the line III-III' of FIG. 15; and the Y axis represents a concentration of antimony or tellurium.

The concentration of the antimony or tellurium was smaller in amorphous regions AR of the resistance variable film 120 than in a crystalline region CR of the resistance variable film 120. This may be because the antimony or tellurium may relatively vaporize and/or diffuse much more from the amorphous region AR to the crystalline region CR, and may relatively condense very well in the crystalline region CR, as compared with the germanium.

In this case, FIGS. 31A and 31B show a trend of relative elemental concentration in the amorphous regions AR and the crystalline region CR, and not comparing absolute elemental concentration between the amorphous regions AR and the crystalline region CR. For example, the number of germanium atoms may be greater than that of the antimony or tellurium in the crystalline region CR; and the number of the antimony or tellurium atoms may be greater than that of the germanium in the amorphous regions AR.

Also, of all the structures of bonds in the crystalline region CR, the $Ge_2Sb_2Te_5$ structure of bond of germanium/antimony/tellurium (GeSbTe) may be more stable and greater in number. In the amorphous regions AR, there may be much less of the $Ge_2Sb_2Te_5$ structure or bond.

Figure 32:
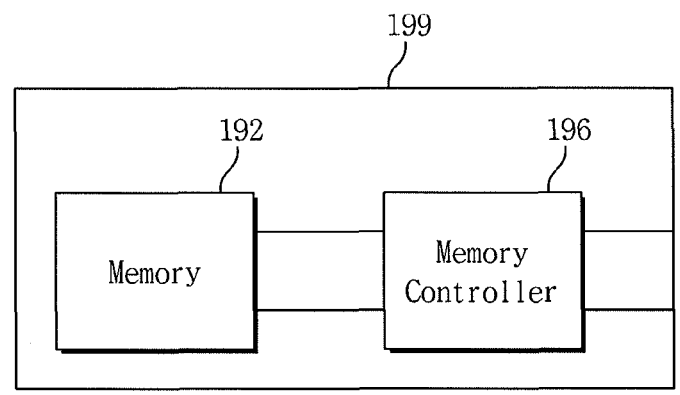
FIG. 32 illustrates a memory card including a resistance variable memory device according to an embodiment.

FIG. 32 schematically illustrates a memory card including a resistance variable memory device according to an embodiment.

Referring to FIG. 32, the memory card 199 may include a memory 192 and a memory controller 196. The memory 192 may include the resistance variable memory device 170A or 170B of FIG. 22 or 29. The memory controller 196 may be electrically connected to the memory 192 and may control the memory 192. In this case, the controller 196 may control the memory 192 according to a control signal from an exterior device, which may be electrically connected to the memory card 199.

Figure 33:
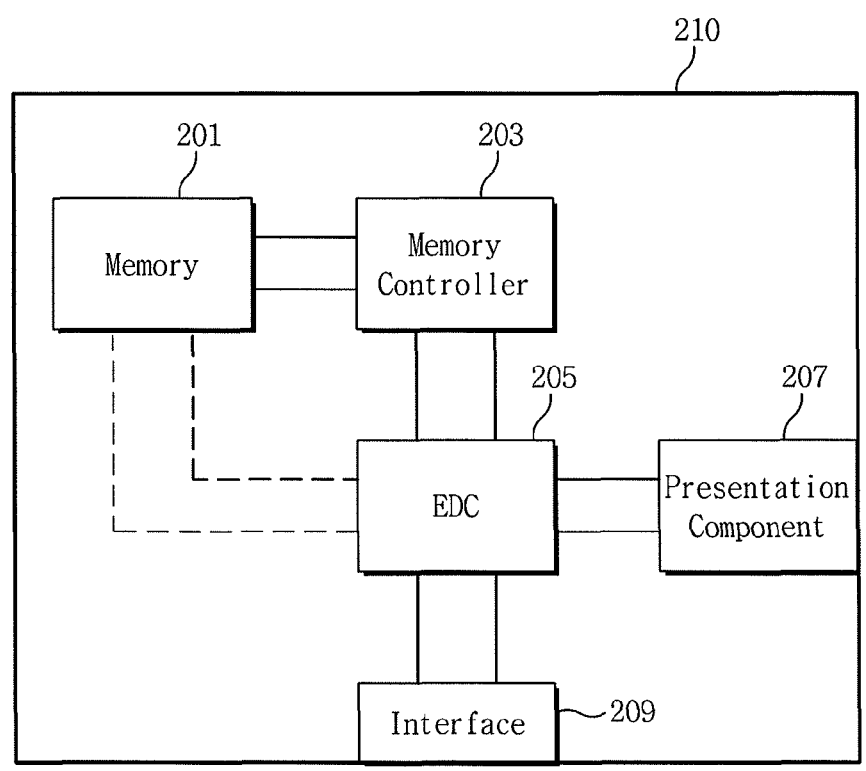
FIG. 33 illustrates a mobile device including a resistance variable memory device according to an embodiment.

FIG. 33 schematically illustrates a mobile device including a resistance variable memory device according to an embodiment.

Referring to FIG. 33, the mobile device 210 may include a memory 201 and a memory controller 203. The memory 201 may include the resistance variable memory device 170A or 170B of FIG. 22 or 29. The memory controller 203 may be electrically connected to the memory 201.

The mobile device 210 may further include an encoder and decoder EDC 205, a presentation component 207 and an interface 209. The encoder and decoder EDC 205 may be electrically connected to the memory 201 and the memory controller 203. The encoder and decoder EDC 205 may exchange data with the memory 201 through the memory controller 203.

Also, the encoder and decoder EDC 205 may directly exchange data with the memory 201 along a dotted line. In this case, the encoder and decoder EDC 205 may encode data and may store the encoded data in the memory 201. Further, the encoder and decoder EDC 205 may decode output data from the memory 201. The encoder and decoder EDC 205 may be electrically connected to the presentation component 207 and the interface 209.

The presentation component 207 may represent the decoded data by the memory 201 and/or the encoder and decoder EDC 205 to a user. The interface 209 may exchange data with the encoder and decoder EDC 205. The interface 209 may output data provided from the memory 201. The mobile device 210 may include an MP3 player, a video player, a video, or an audio player.

Figure 34:
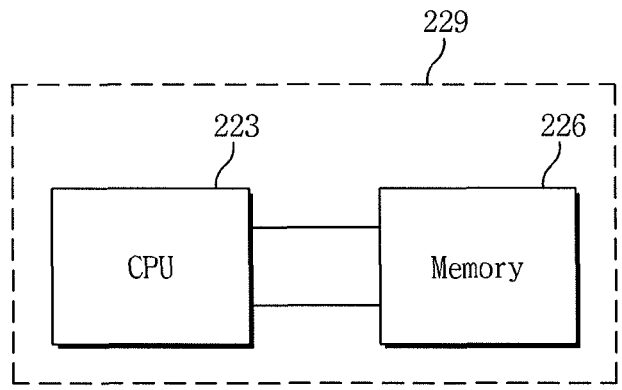
FIG. 34 illustrates a computer system including a resistance variable memory device according to an embodiment.

FIG. 34 schematically illustrates a computer system including a resistance variable memory device according to an embodiment.

Referring to FIG. 34, the computer system 229 may include a central processing unit (CPU) 223 and a memory 226. The memory 226 may include the resistance variable memory device 170A or 170B of FIG. 22 or 29. The computer system 229 may include a personal computer or a personal data assistant.

Figure 35:
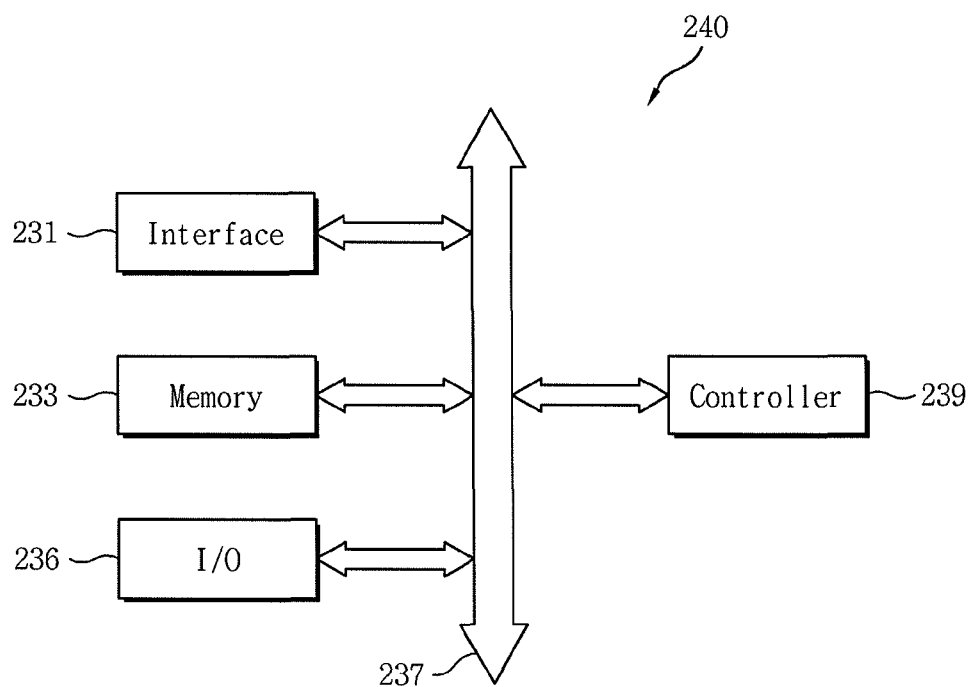
FIG. 35 illustrates a mobile system including a resistance variable memory device according to an embodiment.

FIG. 35 schematically illustrates a mobile system including a resistance variable memory device according to an embodiment.

Referring to FIG. 35, the mobile system 240 may include an interface 231, a memory 233, an input/output (I/O) device 236, and a controller 239. The interface 231 may be electrically connected to the memory 233, the input/output (I/O) device 236, and the controller 239 through a bus 237. The interface 231 may exchange data with an exterior system.

The memory 233 may include the resistance variable memory device 170A or 170B of FIG. 22 or 29. The memory 233 may store a command, which may be executed by data and/or the controller 239. The controller 239 may include a microprocessor, a digital processor, or a microcontroller. The mobile system 240 may include a PDA, a portable computer, a web tablet, a wireless phone, a mobile phone, or a digital music player.

By way of summation and review, a resistance variable pattern may be formed by depositing a resistance variable film in an opening of an insulating film and on a top surface of an insulating film and planarizing the resistance variable film until exposing the insulating film. The resistance variable film may be formed using a physical vapor deposition equipment.

However, in some cases, the resistance variable film may only be partially filled in the opening of the insulating film owing to a 3-dimensional structure of the opening in the insulating film and a deposition property of the physical vapor deposition equipment. The resistance variable film may form an undesirable seam and/or a void at a surface thereof in an entrance of the opening. After the planarization of the resistance variable film by, e.g., a chemical mechanical polishing process, the seam and/or the void may remain in the resistance variable pattern.

Furthermore, the chemical mechanical polishing process may fill a slurry and/or a process by-product in the seam and/or the void, and may damage an interior of the resistance variable pattern through the seam and/or the void. The seam and/or the void may cause an undesirable explosion of the resistance variable pattern during an electrical test of the semiconductor device. Accordingly, the seam and/or the void may deteriorate an electrical characteristic of the semiconductor device.

As described above, a method of forming a resistance variable memory device according to an embodiment may provide a way of filling an opening of an insulating film on a semiconductor substrate with a resistance variable film, which may be formed by using a physical vapor deposition apparatus. In this case, the physical vapor deposition apparatus may fill the opening with the resistance variable film and vaporized elements from the resistance variable film without forming a void or seam in the opening.

The resistance variable memory device may be equipped in a memory card, a mobile device, a computer system, and/or a mobile system. The memory card, the mobile device, the computer system, and/or the mobile system may excellently embody a desired and circuital performance by using the resistance variable memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a resistance variable memory device, the method comprising:
   forming a diode on a semiconductor substrate;
   forming a lower electrode on the diode;
   forming a first insulating film on the lower electrode, the first insulating film having an opening;
   forming a resistance variable film filling the opening such that the resistance variable film includes an amorphous region adjacent to a sidewall of the opening and a crystalline region that extends from a top surface of the resistance variable film to be adjacent to the lower electrode; and
   forming an upper electrode on the resistance variable film.

2. The method as claimed in claim 1, wherein the resistance variable film includes:
   a first element having a heat of vaporization of greater than about 200 kJ/mol,
   a chalcogen element having a heat of vaporization of less than about 200 kJ/mol, and
   at least one of a metal element, a metalloid element, and a nonmetal element.

3. The method as claimed in claim 2, wherein a concentration of the first element in the crystalline region is lower than a concentration of the first element in the amorphous region.

4. The method as claimed in claim 3, wherein a concentration of the chalcogen element in the crystalline region is higher than a concentration of the chalcogen element in the amorphous region.

5. The method as claimed in claim 4, wherein the first element includes germanium.

6. The method as claimed in claim 2, wherein the resistance variable film further includes a second element having a heat of vaporization of less than about 200 kJ/mol.

7. The method as claimed in claim 6, wherein the first element includes germanium, the chalcogen element includes tellurium, and the second element includes antimony.

8. The method as claimed in claim 7, wherein the crystalline region includes a greater amount of a $Ge_2Sb_2Te_5$ structure than an amount thereof in the amorphous region.

9. The method as claimed in claim 1, further comprising forming a second insulating film having a contact hole therein, wherein:
   the contact hole is filled with the diode and the lower electrode, and
   the opening has a trench shape.

10. A method of forming a resistance variable memory device, the method comprising:
    preparing a deposition apparatus such that the deposition apparatus includes a substrate chucking member and a target in a process chamber, the substrate chucking member including a heater and the target including a deposition source material;
    mounting a semiconductor substrate on the substrate chucking member in the process chamber, the semiconductor substrate including an insulating film having an opening therein;
    injecting a process gas into the process chamber, exciting the process gas, and transforming the process gas into a plasma;
    colliding ions of the plasma with the target to separate the deposition source material from the target;
    depositing the deposition source material on a top surface of the insulating film to form a first deposition film partially filling the opening; and
    forming a second deposition film on the first deposition film,
    wherein:
    forming the second deposition film includes vaporizing a part of the deposition source material in the first deposition film, so that the vaporized part of the deposition source material moves to an interior of the opening, and
    the deposition source material includes a first element having a heat of vaporization of greater than about 200 kJ/mol, a second element including a chalcogen element, and a third element having a heat of vaporization of less than about 200 kJ/mol.

11. The method as claimed in claim 10, wherein the deposition source material further includes at least one of bismuth, carbon, oxygen, nitrogen, boron, aluminum, phosphorus, gallium, and arsenic.

12. The method as claimed in claim 10, wherein:
    the process gas includes an inert gas,
    the process chamber has an internal pressure of about 0.1 mTorr to about 10 mTorr, and
    the heater has a temperature of about 260° C. to about 350° C.

13. The method as claimed in claim 10, wherein a distance between the semiconductor substrate and the target is about 200 mm to about 600 mm.

14. The method as claimed in claim 10, wherein:
    vaporized parts of the deposition source material include the chalcogen element, and
    a concentration of the chalcogen element in the opening is higher than a concentration thereof on the insulating film.

15. The method as claimed in claim 10, wherein the first deposition film is conformally formed along a sidewall of the opening and the top surface of the insulating film.

16. The method as claimed in claim 10, further comprising processing the first deposition film and the second deposition film to form a resistance variable film in the opening, processing the first deposition film and second deposition film including forming an amorphous region adjacent to sidewalls of the opening and a crystalline region surrounded by the amorphous region.

17. A method of forming a resistance variable memory device, the method comprising:
    providing a semiconductor substrate;
    forming a word line in the semiconductor substrate;
    forming a first insulating film on the word line such that the first insulating film includes a first connection hole therein;
    forming a switching device in the first connection hole;
    forming a second insulating film on the first insulating film such that the second insulating film includes a second connection hole therein;

forming a lower electrode in the second connection hole such that the lower electrode is connected to the switching device;

forming a third insulating film on the second insulating film such that the third insulating film includes an opening therein;

depositing a resistance variable film on the third insulating film and in the opening such that the resistance variable film includes:
- a first element having a heat of vaporization of greater than about 200 kJ/mol,
- a chalcogen element having a heat of vaporization of less than about 200 kJ/mol, and
- at least one second element, the second element including a metal element, a metalloid element, or a non-metal element;

processing the resistance variable film such that some of the chalcogen element and the second element of the resistance variable film is transferred from a top of the third insulating film to an interior of the opening to fill the opening, wherein processing the resistance variable film includes forming an amorphous region adjacent to sidewalls of the opening and a crystalline region surrounded by the amorphous region;

forming a resistance variable pattern by removing portions of the resistance variable film such that a top surface of the third insulating film is exposed; and forming an upper electrode on the resistance variable pattern.

18. The method as claimed in claim 17, wherein a concentration of the first element in the crystalline region is lower than a concentration of the first element in the amorphous region.

19. The method as claimed in claim 17, wherein the first element includes germanium, the chalcogen element includes tellurium, and the second element includes antimony.

20. The method as claimed in claim 17, wherein the second element has a heat of vaporization of less than about 200 kJ/mol.

* * * * *